(12) United States Patent
Yang et al.

(10) Patent No.: US 7,211,879 B1
(45) Date of Patent: May 1, 2007

(54) SEMICONDUCTOR PACKAGE WITH CHAMFERED CORNERS AND METHOD OF MANUFACTURING THE SAME

(75) Inventors: Sung Jin Yang, Gangnam-gu (KR); Sun Ho Ha, Eunpyeong-gu (KR); Ki Ho Kim, Gangdong-gu (KR); Sun Jin Son, Seongbuk-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 544 days.

(21) Appl. No.: 10/706,468

(22) Filed: Nov. 12, 2003

(51) Int. Cl.
    *H01L 23/495* (2006.01)
(52) U.S. Cl. ........................ 257/666; 257/676
(58) Field of Classification Search ............... 257/666, 257/675, 684, 696, 698, 711, 676, 678
    See application file for complete search history.

(56) References Cited

U.S. PATENT DOCUMENTS

| | | | |
|---|---|---|---|
| 2,596,993 | A | 5/1952 | Gookin |
| 3,435,815 | A | 4/1969 | Forcier |
| 3,734,660 | A | 5/1973 | Davies et al. |
| 3,838,984 | A | 10/1974 | Crane et al. |
| 4,054,238 | A | 10/1977 | Lloyd et al. |
| 4,189,342 | A | 2/1980 | Kock |
| 4,258,381 | A | 3/1981 | Inaba |
| 4,289,922 | A | 9/1981 | Devlin |
| 4,301,464 | A | 11/1981 | Otsuki et al. |
| 4,332,537 | A | 6/1982 | Slepcevic |
| 4,417,266 | A | 11/1983 | Grabbe |
| 4,451,224 | A | 5/1984 | Harding |
| 4,530,152 | A | 7/1985 | Roche et al. |
| 4,541,003 | A | 9/1985 | Otsuka et al. |
| 4,646,710 | A | 3/1987 | Schmid et al. |
| 4,707,724 | A | 11/1987 | Suzuki et al. |
| 4,727,633 | A | 3/1988 | Herrick |
| 4,737,839 | A | 4/1988 | Burt |
| 4,756,080 | A | 7/1988 | Thorp, Jr. et al. |
| 4,812,896 | A | 3/1989 | Rothgery et al. |

(Continued)

FOREIGN PATENT DOCUMENTS

DE     19734794 A1    8/1997

(Continued)

*Primary Examiner*—Howard Weiss
*Assistant Examiner*—(Vikki) Hoa B. Trinh
(74) *Attorney, Agent, or Firm*—Stetina Brunda Garred & Brucker

(57) ABSTRACT

A semiconductor package comprising a die paddle defining multiple corners and opposed first and second surfaces. At least one set of leads extends at least partially about the die paddle in spaced relation thereto. Each of the leads has opposed first and second surfaces. Attached to and extending from one of the corners of the die paddle is at least one tie bar which itself has opposed first and second surfaces and at least one aperture disposed therein and extending between the first and second surfaces thereof. Attached to the first surface of the die paddle is a semiconductor die which is electrically connected to at least one of the leads. A package body at least partially covers the die paddle, the leads, the tie bar and the semiconductor die such that the second surfaces of the leads are exposed in and substantially flush with a common exterior surface of the package body, and a portion of the package body extends through the aperture of the tie bar.

25 Claims, 18 Drawing Sheets

U.S. PATENT DOCUMENTS

| | | |
|---|---|---|
| 4,862,245 A | 8/1989 | Pashby et al. |
| 4,862,246 A | 8/1989 | Masuda et al. |
| 4,907,067 A | 3/1990 | Derryberry |
| 4,920,074 A | 4/1990 | Shimizu et al. |
| 4,935,803 A | 6/1990 | Kalfus et al. |
| 4,942,454 A | 7/1990 | Mori et al. |
| 4,987,475 A | 1/1991 | Schlesinger et al. |
| 5,018,003 A | 5/1991 | Yasunaga et al. |
| 5,029,386 A | 7/1991 | Chao et al. |
| 5,041,902 A | 8/1991 | McShane |
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, 3rd et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |

| | | | | | | |
|---|---|---|---|---|---|---|
| 5,981,314 | A | 11/1999 | Glenn et al. | 6,326,243 | B1 | 12/2001 | Suzuya et al. |
| 5,986,333 | A | 11/1999 | Nakamura | 6,326,244 | B1 | 12/2001 | Brooks et al. |
| 5,986,885 | A | 11/1999 | Wyland | 6,326,678 | B1 | 12/2001 | Karmezos et al. |
| 6,001,671 | A | 12/1999 | Fjelstad | 6,335,564 | B1 | 1/2002 | Pour |
| 6,013,947 | A | 1/2000 | Lim | 6,337,510 | B1 | 1/2002 | Chun-Jen et al. |
| 6,018,189 | A | 1/2000 | Mizuno | 6,339,255 | B1 | 1/2002 | Shin |
| 6,020,625 | A | 2/2000 | Qin et al. | 6,348,726 | B1 | 2/2002 | Bayan et al. |
| 6,025,640 | A | 2/2000 | Yagi et al. | 6,355,502 | B1 | 3/2002 | Kang et al. |
| 6,031,279 | A | 2/2000 | Lenz | 6,369,447 | B2 | 4/2002 | Mori |
| RE36,613 | E | 3/2000 | Ball | 6,369,454 | B1 | 4/2002 | Chung |
| 6,034,423 | A | 3/2000 | Mostafazadeh | 6,373,127 | B1 | 4/2002 | Baudouin et al. |
| 6,040,626 | A | 3/2000 | Cheah et al. | 6,380,048 | B1 | 4/2002 | Boon et al. |
| 6,043,430 | A | 3/2000 | Chun | 6,384,472 | B1 | 5/2002 | Huang |
| 6,060,768 | A | 5/2000 | Hayashida et al. | 6,388,336 | B1 | 5/2002 | Venkateshwaran et al. |
| 6,060,769 | A | 5/2000 | Wark | 6,395,578 | B1 | 5/2002 | Shin et al. |
| 6,072,228 | A | 6/2000 | Hinkle et al. | 6,400,004 | B1 | 6/2002 | Fan et al. |
| 6,075,284 | A | 6/2000 | Choi et al. | 6,410,979 | B2 | 6/2002 | Abe |
| 6,081,029 | A | 6/2000 | Yamaguchi | 6,414,385 | B1 | 7/2002 | Huang et al. |
| 6,084,310 | A | 7/2000 | Mizuno et al. | 6,420,779 | B1 | 7/2002 | Sharma et al. |
| 6,087,715 | A | 7/2000 | Sawada et al. | 6,429,508 | B1 | 8/2002 | Gang |
| 6,087,722 | A | 7/2000 | Lee et al. | 6,437,429 | B1 | 8/2002 | Su et al. |
| 6,100,594 | A | 8/2000 | Fukui et al. | 6,444,499 | B1 | 9/2002 | Swiss et al. |
| 6,113,474 | A | 9/2000 | Costantini et al. | 6,448,633 | B1 | 9/2002 | Yee et al. |
| 6,118,174 | A | 9/2000 | Kim | 6,452,279 | B2 | 9/2002 | Shimoda |
| 6,118,184 | A | 9/2000 | Ishio et al. | 6,464,121 | B2 | 10/2002 | Reijnders |
| RE36,907 | E | 10/2000 | Templeton, Jr. et al. | 6,476,469 | B2 | 11/2002 | Hung et al. |
| 6,130,115 | A | 10/2000 | Okumura et al. | 6,476,474 | B1 | 11/2002 | Hung |
| 6,130,473 | A | 10/2000 | Mostafazadeh et al. | 6,482,680 | B1 | 11/2002 | Khor et al. |
| 6,133,623 | A | 10/2000 | Otsuki et al. | 6,498,099 | B1 | 12/2002 | McLellan et al. |
| 6,140,154 | A | 10/2000 | Hinkle et al. | 6,498,392 | B2 | 12/2002 | Azuma |
| 6,143,981 | A | 11/2000 | Glenn | 6,507,096 | B2 | 1/2003 | Gang |
| 6,169,329 | B1 | 1/2001 | Farnworth et al. | 6,507,120 | B2 | 1/2003 | Lo et al. |
| 6,177,718 | B1 | 1/2001 | Kozono | 6,534,849 | B1 | 3/2003 | Gang |
| 6,181,002 | B1 | 1/2001 | Juso et al. | 6,545,345 | B1 | 4/2003 | Glenn et al. |
| 6,184,465 | B1 | 2/2001 | Corisis | 6,559,525 | B2 | 5/2003 | Huang |
| 6,184,573 | B1 | 2/2001 | Pu | 6,566,168 | B2 | 5/2003 | Gang |
| 6,194,777 | B1 | 2/2001 | Abbott et al. | 2001/0008305 | A1 | 7/2001 | McLellan et al. |
| 6,197,615 | B1 | 3/2001 | Song et al. | 2001/0014538 | A1 | 8/2001 | Kwan et al. |
| 6,198,171 | B1 | 3/2001 | Huang et al. | 2002/0011654 | A1 | 1/2002 | Kimura |
| 6,201,186 | B1 | 3/2001 | Daniels et al. | 2002/0024122 | A1 | 2/2002 | Jung et al. |
| 6,201,292 | B1 | 3/2001 | Yagi et al. | 2002/0027297 | A1 | 3/2002 | Ikenaga et al. |
| 6,204,554 | B1 | 3/2001 | Ewer et al. | 2002/0140061 | A1 | 10/2002 | Lee |
| 6,208,020 | B1 | 3/2001 | Minamio | 2002/0140068 | A1 | 10/2002 | Lee et al. |
| 6,208,021 | B1 | 3/2001 | Ohuchi et al. | 2002/0163015 | A1 | 11/2002 | Lee et al. |
| 6,208,023 | B1 | 3/2001 | Nakayama et al. | 2003/0030131 | A1 | 2/2003 | Lee et al. |
| 6,211,462 | B1 | 4/2001 | Carter, Jr. et al. | 2003/0073265 | A1 | 4/2003 | Hu et al. |
| 6,218,731 | B1 | 4/2001 | Huang et al. | 2003/0168719 | A1* | 9/2003 | Cheng et al. ............... 257/666 |
| 6,222,258 | B1 | 4/2001 | Asano et al. | | | | |
| 6,225,146 | B1 | 5/2001 | Yamaguchi et al. | | | FOREIGN PATENT DOCUMENTS | |
| 6,229,200 | B1 | 5/2001 | McLellan et al. | | | | |
| 6,229,205 | B1 | 5/2001 | Jeong et al. | EP | | 5421117 | 6/1979 |
| 6,239,367 | B1 | 5/2001 | Hsuan et al. | EP | | 5950939 | 3/1984 |
| 6,239,384 | B1 | 5/2001 | Smith et al. | EP | | 0393997 | 10/1990 |
| 6,242,281 | B1 | 6/2001 | McLellan et al. | EP | | 0459493 | 12/1991 |
| 6,256,200 | B1 | 7/2001 | Lam et al. | EP | | 0720225 | 3/1996 |
| 6,258,629 | B1 | 7/2001 | Niones et al. | EP | | 0720234 | 3/1996 |
| 6,281,566 | B1 | 8/2001 | Magni | EP | | 0794572 A2 | 10/1997 |
| 6,281,568 | B1 | 8/2001 | Glenn et al. | EP | | 0844665 | 5/1998 |
| 6,282,095 | B1 | 8/2001 | Houghton et al. | EP | | 0936671 | 8/1999 |
| 6,285,075 | B1 | 9/2001 | Combs et al. | EP | | 098968 | 3/2000 |
| 6,291,271 | B1 | 9/2001 | Lee et al. | EP | | 1032037 | 8/2000 |
| 6,291,273 | B1 | 9/2001 | Miyaki et al. | JP | | 55163868 | 12/1980 |
| 6,294,100 | B1 | 9/2001 | Fan et al. | JP | | 5745959 | 3/1982 |
| 6,294,830 | B1 | 9/2001 | Fjelstad | JP | | 58160095 | 8/1983 |
| 6,295,977 | B1 | 10/2001 | Ripper et al. | JP | | 59208756 | 11/1984 |
| 6,297,548 | B1 | 10/2001 | Moden et al. | JP | | 59227143 | 12/1984 |
| 6,303,984 | B1 | 10/2001 | Corisis | JP | | 60010756 | 1/1985 |
| 6,303,997 | B1 | 10/2001 | Lee | JP | | 60116239 | 8/1985 |
| 6,307,272 | B1 | 10/2001 | Takahashi et al. | JP | | 60195957 | 10/1985 |
| 6,309,909 | B1 | 10/2001 | Ohgiyama | JP | | 60231349 | 11/1985 |
| 6,316,822 | B1 | 11/2001 | Venkateshwaran et al. | JP | | 6139555 | 2/1986 |
| 6,316,838 | B1 | 11/2001 | Ozawa et al. | JP | | 629639 | 1/1987 |
| 6,323,550 | B1 | 11/2001 | Martin et al. | JP | | 63067762 | 3/1988 |

| | | | | | | |
|---|---|---|---|---|---|---|
| JP | 63205935 | 8/1988 | | JP | 98205 | 1/1997 |
| JP | 63233555 | 9/1988 | | JP | 98206 | 1/1997 |
| JP | 63249345 | 10/1988 | | JP | 98207 | 1/1997 |
| JP | 63316470 | 12/1988 | | JP | 992775 | 4/1997 |
| JP | 64054749 | 3/1989 | | JP | 9293822 | 11/1997 |
| JP | 1106456 | 4/1989 | | JP | 10022447 | 1/1998 |
| JP | 1175250 | 7/1989 | | JP | 10163401 | 6/1998 |
| JP | 1205544 | 8/1989 | | JP | 10199934 | 7/1998 |
| JP | 1251747 | 10/1989 | | JP | 10256240 | 9/1998 |
| JP | 3177060 | 8/1991 | | JP | 00150765 | 5/2000 |
| JP | 4098864 | 9/1992 | | JP | 556398 | 10/2000 |
| JP | 5129473 | 5/1993 | | JP | 2001060648 | 3/2001 |
| JP | 5166992 | 7/1993 | | JP | 200204397 | 8/2002 |
| JP | 5283460 | 10/1993 | | KR | 941979 | 1/1994 |
| JP | 692076 | 4/1994 | | KR | 199410938 | 5/1994 |
| JP | 6140563 | 5/1994 | | KR | 199552621 | 12/1995 |
| JP | 6260532 | 9/1994 | | KR | 9772358 | 11/1997 |
| JP | 7297344 | 11/1995 | | KR | 100220154 | 6/1999 |
| JP | 7312405 | 11/1995 | | KR | 0049944 | 6/2002 |
| JP | 864634 | 3/1996 | | WO | 9956316 | 11/1999 |
| JP | 8083877 | 3/1996 | | WO | 9967821 | 12/1999 |
| JP | 8125066 | 5/1996 | | | | |
| JP | 8222682 | 8/1996 | | | | |
| JP | 8306853 | 11/1996 | | | | |

* cited by examiner

SEMICONDUCTOR PACKAGE WITH CHAMFERED CORNERS AND METHOD OF MANUFACTURING THE SAME

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages, and more particularly to a semiconductor package having corners which are reinforced in a manner reducing occurrences of chip-out in the package body of the semiconductor package, and a method of manufacturing such semiconductor package.

2. Description of the Related Art

Semiconductor dies are conventionally enclosed in plastic packages that provide protection from hostile environments and enable electrical interconnection between the semiconductor die and an underlying substrate such as a printed circuit board (PCB) or motherboard. The elements of such a package include a metal leadframe, an integrated circuit or semiconductor die, bonding material to attach the semiconductor die to the leadframe, bond wires which electrically connect pads on the semiconductor die to individual leads of the leadframe, and a hard plastic encapsulant material which covers the other components and forms the exterior of the semiconductor package commonly referred to as the package body.

The leadframe is the central supporting structure of such a package, and is typically fabricated by chemically etching or mechanically stamping a metal strip. A portion of the leadframe is internal to the package, i.e., completely surrounded by the plastic encapsulant or package body. Portions of the leads of the leadframe extend externally from the package body or are partially exposed therein for use in electrically connecting the package to another component.

In the electronics industry, hand held portable applications such as cell phones, PDA's (Personal Digital Assistants), Bluetooth, and IMT2000 require semiconductor packages which are progressively smaller and lighter, yet of increasing performance. In many of the above-described conventional semiconductor packages wherein portions of the leads are partially exposed within the package body, such leads are typically included along only the peripheral edge of the package body. To meet the requirements of current hand held portable applications, the semiconductor packages used therein must have higher electrical performance and functionality, and thus increased numbers of leads which are electrically connectable to an external device. Although it has been suggested in the prior art to narrow the pitch of the leads formed at the periphery of the bottom surface of the package body to increase the number of leads, there are physical limitations in narrowing the lead pitch during the manufacture of the leadframe. Also, excessive narrowing in the lead pitch gives rise to a susceptibility of solder shorting between the leads when the semiconductor package is connected to an external device through the use of solder.

Other currently known semiconductor package designs provide increased number of leads by arranging the leads on a common surface of the package body in multiple rows and columns. However, the manufacturing methodology associated with such semiconductor package designs typically involves the completion of a sawing process wherein a saw blade is advanced completely through portions of the leadframe and partially into portions of the package body of the semiconductor package. More particularly, the advancement of the saw blade through portions of the leadframe effectively electrically isolates such portions from each other in a manner facilitating the formation of multiple columns and rows of leads. However, as a result of the sawing or singulation of the leadframe to facilitate the formation of the leads, the saw blade must necessarily cut into the package body as well. In this regard, the sawing process often gives rise to occurrences of chip-out or cracking in one or more of the four corners of the package body (which is typically square or rectangular), such chip-out or cracking being attributable to stress being concentrated on the four corners of the package body.

In those semiconductor package designs wherein multiple sets of leads are arranged to extend fully or partially about a die pad of the leadframe, a punch (as opposed to a saw) singulation process is sometimes used during the fabrication of such semiconductor packages to separate adjacent semiconductor packages arranged in a matrix from each other, a saw singulation process still being employed to electrically isolate portions of the leadframe from each other in a manner defining multiple sets of the leads. Similarly, in semiconductor package designs which include only a single set of leads extending fully or partially about the die pad of the leadframe, a punch singulation process is often employed as an alternative to a saw singulation process to effectively separate adjacent semiconductor packages arranged in a matrix from each other. When punch singulation is employed, the punch is typically configured such that each of the four corners of the package body is chamfered as a result of the punching operation. However, in the punch singulation process, the magnitude of the impact applied to the four corners of the semiconductor package attributable to the physical friction between the punch or singulation tool and the encapsulant material which forms the package body still results in occurrences of chip-out and cracking in the corners of the package body. In certain instances, the leads of the semiconductor package disposed in close proximity to each of the four corners of the package body may be completely separated from the package body as a result of the punch singulation process. The present invention addresses the chip-out and cracking problems that frequently arise as a result of the completion of punch and/or saw singulation processes on the package bodies of semiconductor packages which include either a single set or multiple sets of leads. More particularly, in accordance with the present invention, each of the four corner regions of the semiconductor package is reinforced to prevent the above-described occurrences of chip-out and cracking. These and other features of the present invention will be described in more detail below.

BRIEF SUMMARY OF THE INVENTION

In accordance with the present invention, there is provided multiple embodiments of a semiconductor package which is specifically configured to prevent occurrences of chip-out and cracking in the corner regions of the package body which normally occurs as a result of stress concentrations therein. More particularly, in the present invention, such chip-out and/or cracking is prevented by providing either chamfers or recesses at or within each of the four corner regions of the package body. In each embodiment of the present invention, the tie bars extend to either the chamfer or the recess included at each corner region. In the embodiment of the present invention including the chamfer at each corner of the package body, each tie bar is provided with at least one aperture which is located in close proximity to the corresponding chamfer. Such aperture is filled with the encapsulation material which hardens into the package body, the flow of the encapsulation material through the aperture facilitating a firm mechanical interlock between the tie bar and the package body. Such mechanical interlock provides a higher degree of support to the package body at each corner region thereof, thus assisting in the prevention of the chip-out and/or cracking problem.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
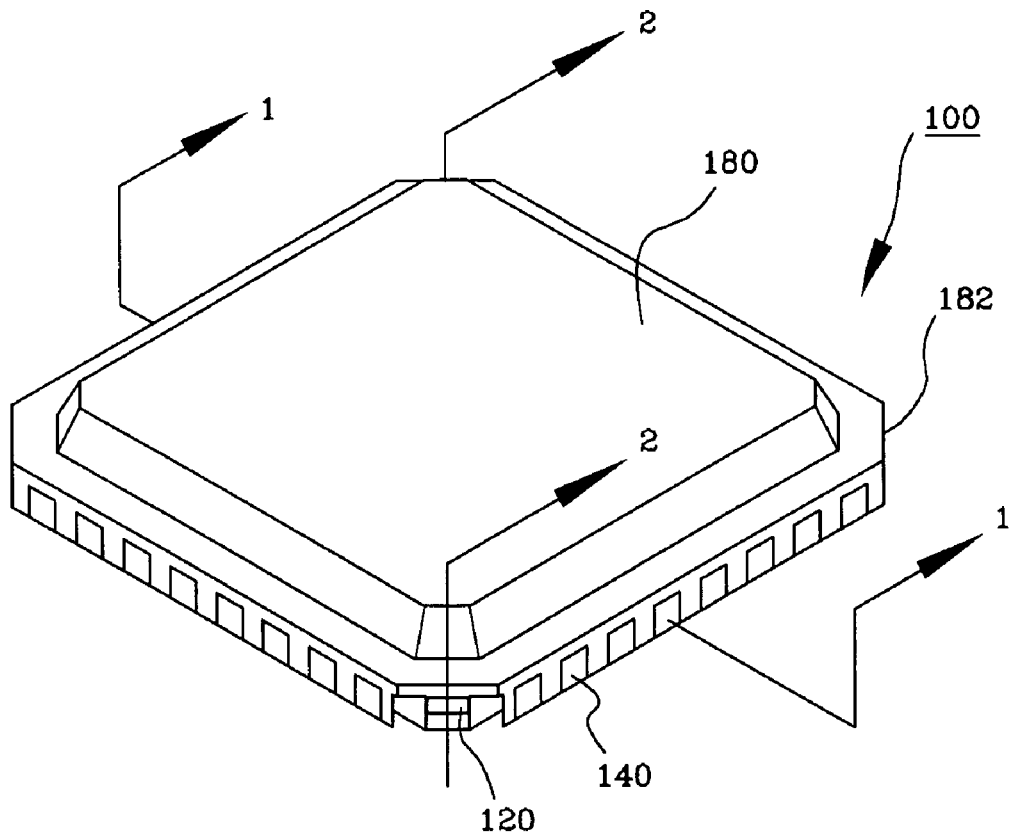
FIG. 1A is a top perspective view of a semiconductor package constructed in accordance with a first embodiment of the present invention.

Referring now to the drawings wherein the showings are for purposes of illustrating preferred embodiments of the present invention only, and not for purposes of limiting the same, FIGS. 1A–1E illustrate a semiconductor package 100 constructed in accordance with a first embodiment of the present invention. Semiconductor package 100 comprises a leadframe including a die paddle 110 having a generally planar first (top) surface 111 and an opposed, generally planar second (bottom) surface 112. In addition to the first and second surfaces 110, 112, the die paddle 110 includes a partially etched surface 113 which is disposed in opposed relation to the first surface 111 and circumvents the second surface 112. More particularly, the etched surface 113 is perpendicularly recessed relative to the second surface 112. The etched surface 113 is used to increase the bonding or adhesion force between the package body of the semiconductor package 100 and the die paddle 110, as will be discussed in more detail below. The die paddle 110 preferably has a generally quadrangular shape (e.g., square, rectangular) defining four sides or peripheral edge segments, and hence four corners.

In addition to the die paddle 110, the leadframe of the semiconductor package 100 comprises a plurality of tie bars 120 which are integrally connected to and extend diagonally from each of the four corners of the die paddle 110. Each of the tie bars 120 defines a generally planar first (top) surface 121 and an opposed, generally planar second (bottom) surface 122. The first surface 121 of each tie bar 120 extends in substantially flush or continuous relation to the first surface 111 of the die paddle 110. Similarly, the second surface 122 of each tie bar 120 extends in substantially flush or continuous relation to the partially etched surface 113 of the die paddle 110. Accordingly, the thickness of each tie bar 120 (i.e., the distance between the first and second surfaces 121, 122 thereof) is less than the maximum thickness of the die paddle 110 (i.e., the distance between the first and second surfaces 111, 112 thereof). Disposed within each of the tie bars 120 is at least one, and preferably multiple apertures 123. The aperture(s) 123 in each tie bar 120 extend(s) from the first surface 121 to the second surface 122 thereof. Such aperture(s) 123 may be provided in any one of various shapes, including circular, triangular, quadrangular, etc, the present invention not being limited to any specific shape for the apertures 123. Each tie bar 120 preferably includes three apertures 123 formed therein. However, those of ordinary skill in the art will recognize that greater or fewer than three apertures 123 may be formed in each tie bar 120. It is contemplated that the sole aperture 123 formed in each tie bar 120 or one of multiple apertures 123 formed therein will be disposed in close proximity to the outer, distal end surface 124 of the corresponding tie bar 120, as will be described in more detail below.

In addition to the die paddle 110 and tie bars 120, the leadframe of the semiconductor package 100 comprises a plurality of leads 130, 140. The leads 130 are arranged in an inner set which circumvents the die paddle 110, with the leads 140 being arranged in an outer set which circumvents the leads 130 of the inner set. More particularly, the leads 130 of the inner set are segregated into four inner groups, with each of the inner groups including a total of six leads 130. Each inner group of the leads 130 extends along and in spaced relation to a respective one of the peripheral edge segments of the die paddle 110. Additionally, each adjacent pair of the inner groups of leads 130 is separated from each other by one of the tie bars 120. The leads 140 of the outer set are themselves segregated into four outer groups, each of the outer groups including a total of eight leads 140. The leads 140 of each outer group other than for those included at each end thereof are aligned with and spaced from respective ones of the leads 130 of the corresponding inner group. Like the inner groups of leads 130, each adjacent pair of the outer groups of leads 140 is separated by one of the tie bars 120. The leads 130, 140 of the inner and outer sets each have a quadrangular configuration, with the leads 140 of the outer set being slightly larger than those of the inner set. Those of ordinary skill in the art will recognize that the leads 130, 140 of the inner and outer sets may have differing shapes, and that each inner and outer group of the leads 130, 140 may be provided in numbers fewer or greater than those indicated above.

In the leadframe of the semiconductor package 100, each of the leads 130 defines a generally planar first (top) surface 131, and an opposed, generally planar second (bottom) surface 132. The first surface 131 of each lead 130 extends in generally co-planar relation to the first surface 111 of the die paddle 110. Similarly, the second surface 132 of each lead 130 extends in generally co-planar relation to the second surface 112 of the die paddle 110.

Similarly, each of the leads 140 has a generally planar first (top) surface 141 and an opposed, generally planar second (bottom) surface 142. The first surface 141 of each lead 140 extends in generally co-planar relation to the first surface 111 of the die paddle 110. The second surface 142 of each lead 140 extends in generally co-planar relation to the second surface 112 of the die paddle 110.

In the leadframe of the semiconductor package 100, the die paddle 110, the tie bars 120, and the leads 130, 140 may be made of copper, a copper alloy, copper plated steel, or an equivalent thereof. However, those of ordinary skill in the art will recognize that the present invention is not limited to any particular material for the leadframe of the semiconductor package 100.

The semiconductor package 100 of the first embodiment further comprises a semiconductor die 150 which includes a generally planar first (top) surface 151, and an opposed, generally planar second (bottom) surface 152. Disposed on the first surface 151 of the semiconductor die 150 in close proximity to the peripheral edge thereof is a plurality of bond pads 153. The second surface 152 of the semiconductor die 150 is attached to the first surface 111 of the die paddle 110 through a layer 160 of die attach material.

In the semiconductor package 100, a plurality of conductive wires 170 are used to electrically connect the bond pads 153 of the semiconductor die 150 to respective ones of the leads 130, 140. More particularly, the conductive wires 170 extend from the first surfaces 131 of the leads 130 to respective ones of the bond pads 153, and from the first surfaces 141 of the leads 140 to respective ones of the bond pads 153. The conductive wires 170 may be made from aluminum, gold, copper, or an equivalent material, though the present invention is not limited to any particular material for the conductive wires 170.

The semiconductor package 100 further comprises a package body 180 which at least partially covers or encapsulates the die paddle 110, the tie bars 120, the leads 130, 140, the semiconductor die 150, and the conductive wires 170. The package body 180 defines a lower surface 181, and four side surface segments. Each adjacent pair of the side surface segments is separated from each other by a chamfer 182, the package body 180 thus including a total of four chamfers 182. In the semiconductor package 100, the second surface 112 of the die paddle 110, the second surface 132 of each of the leads 130, and the second surface 142 of each of the leads 140 are exposed in and substantially flush with the lower surface 181 of the package body 180. The package body 180 further includes multiple (i.e., four) isolation trenches 183 which are formed in the lower surface 181 thereof. The isolation trenches 183 are arranged in a generally square pattern, with each trench 183 separating the leads 130 of each inner group from the leads 140 of the corresponding outer group. Thus, the trenches 183 effectively separate the leads 130 of the inner set from the leads 140 of the outer set.

Figure 1B:
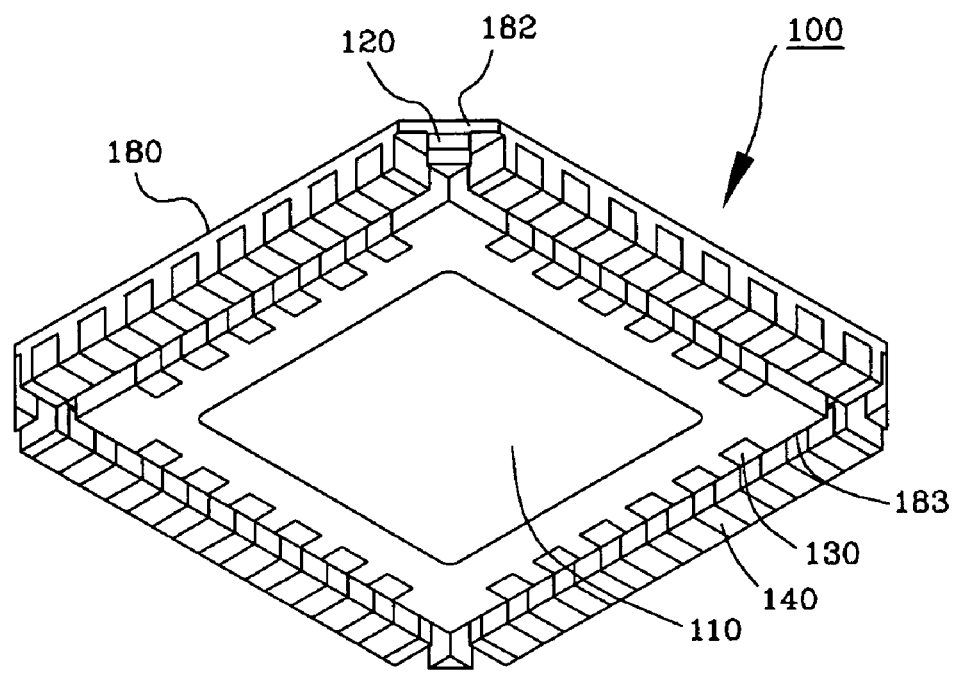
FIG. 1B is a bottom perspective view of the semiconductor package of the first embodiment shown in FIG. 1A.
Figure 1C:
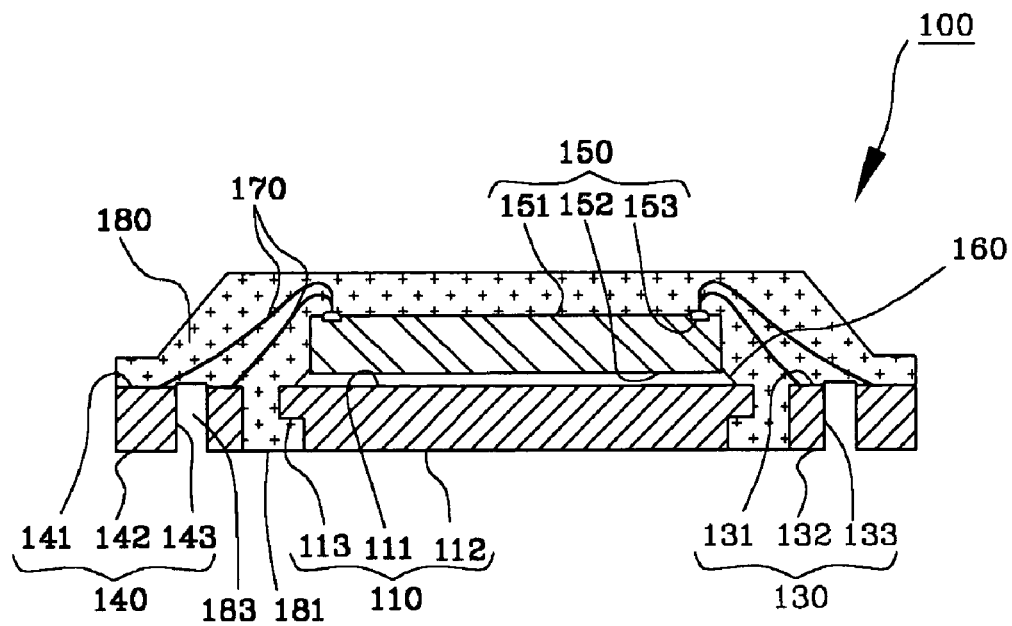
FIG. 1C is a cross-sectional view of the semiconductor package of the first embodiment taken along line 1—1 of FIG. 1A.
Figure 1D:
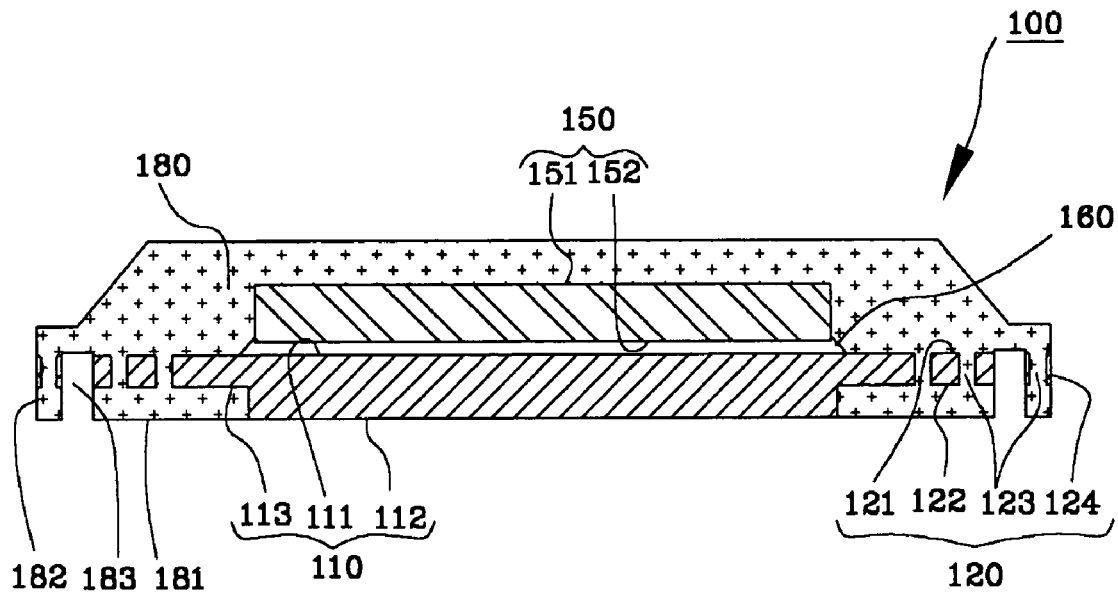
FIG. 1D is a cross-sectional view of the semiconductor package of the first embodiment taken along line 2—2 of FIG. 1A.
Figure 1E:
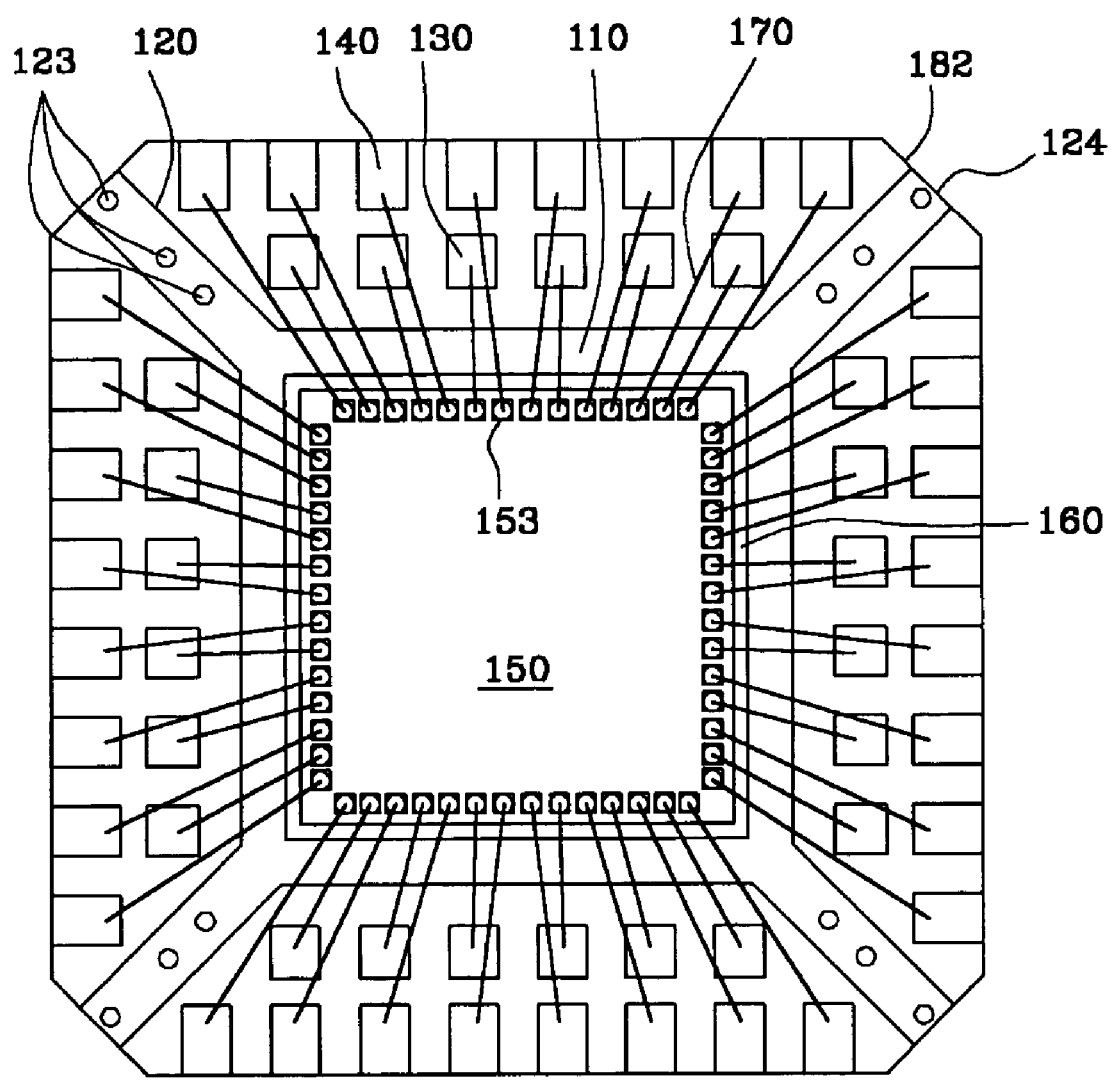
FIG. 1E is a top plan view of the semiconductor package of the first embodiment with the package body thereof being partially removed to depict the internal semiconductor die and conductive wires of the semiconductor package.
Figure 2A:
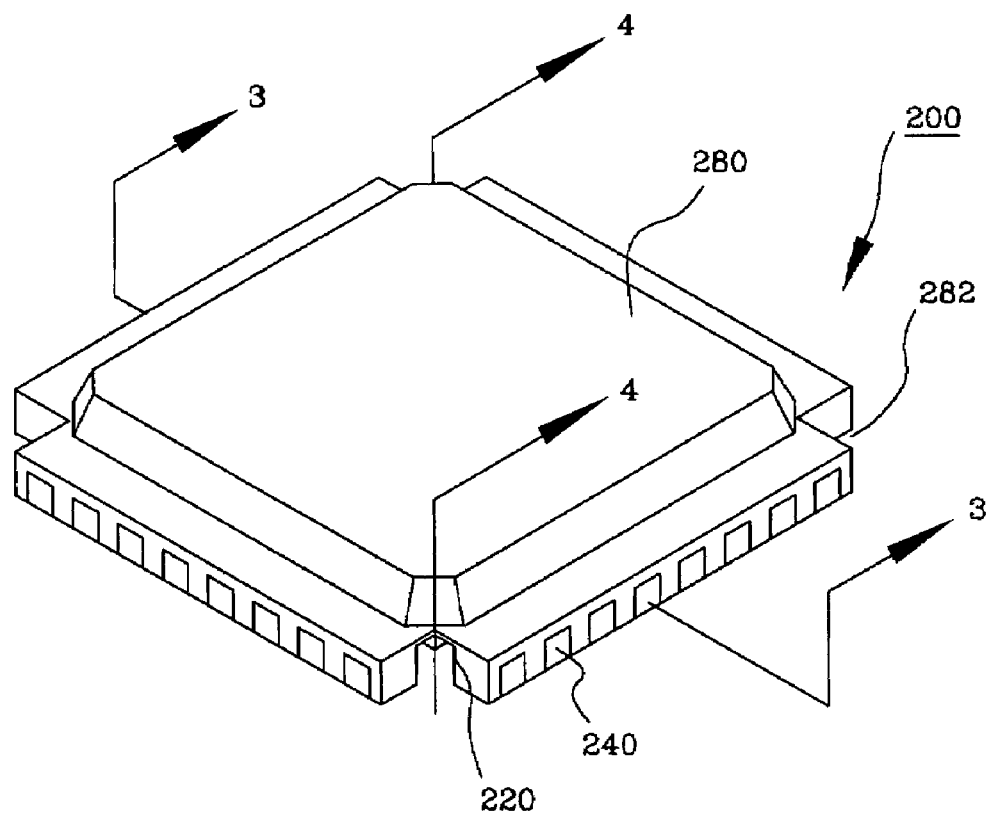
FIG. 2A is a top perspective view of a semiconductor package constructed in accordance with a second embodiment of the present invention.
Figure 2B:
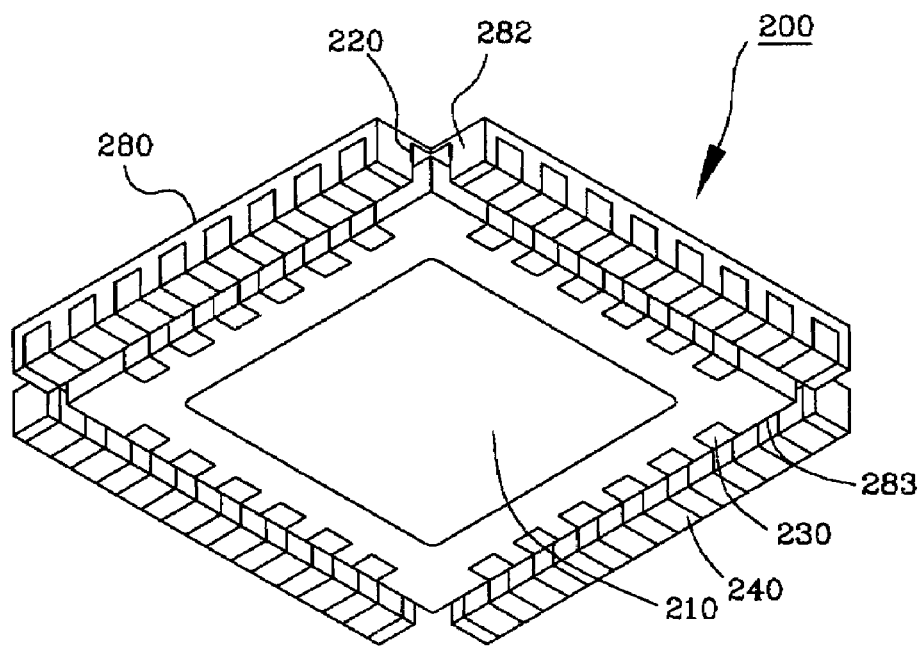
FIG. 2B is a bottom plan view of the semiconductor package of the second embodiment shown in FIG. 2A.
Figure 2C:
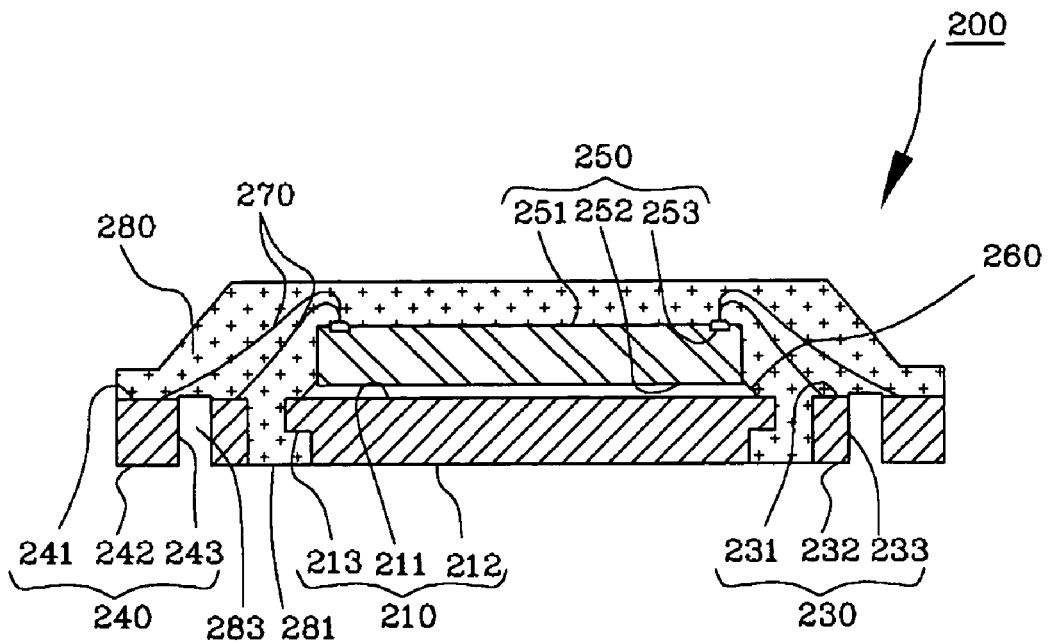
FIG. 2C is a cross-sectional view of the semiconductor package of the second embodiment taken along line 3—3 of FIG. 2A.
Figure 2D:
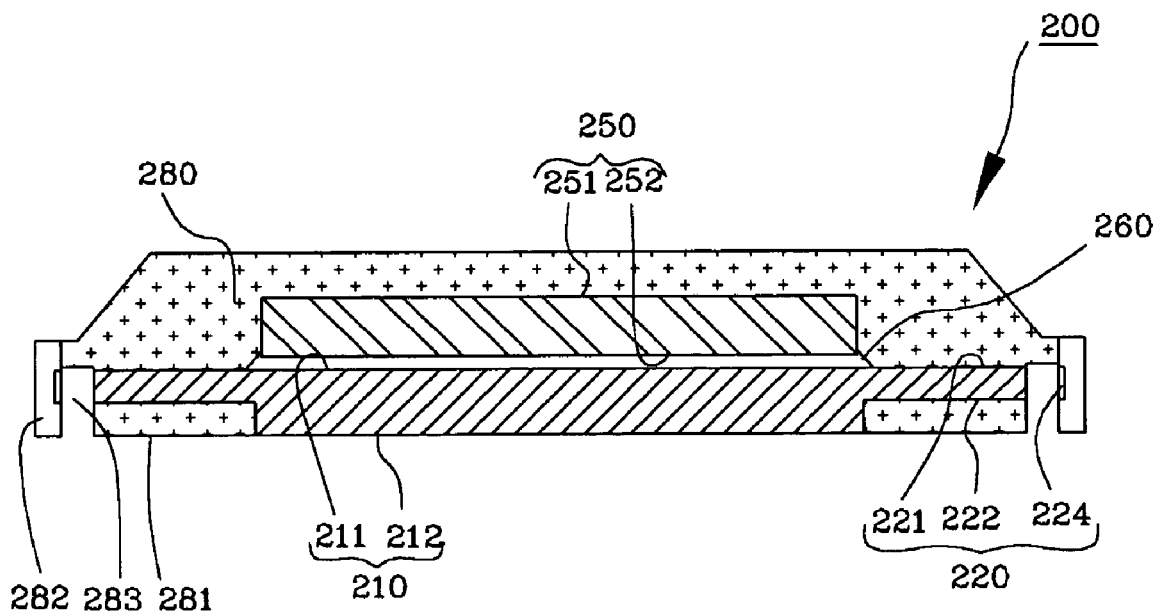
FIG. 2D is a cross-sectional view of the semiconductor package of the second embodiment taken along line 4—4 of FIG. 2A.
Figure 2E:
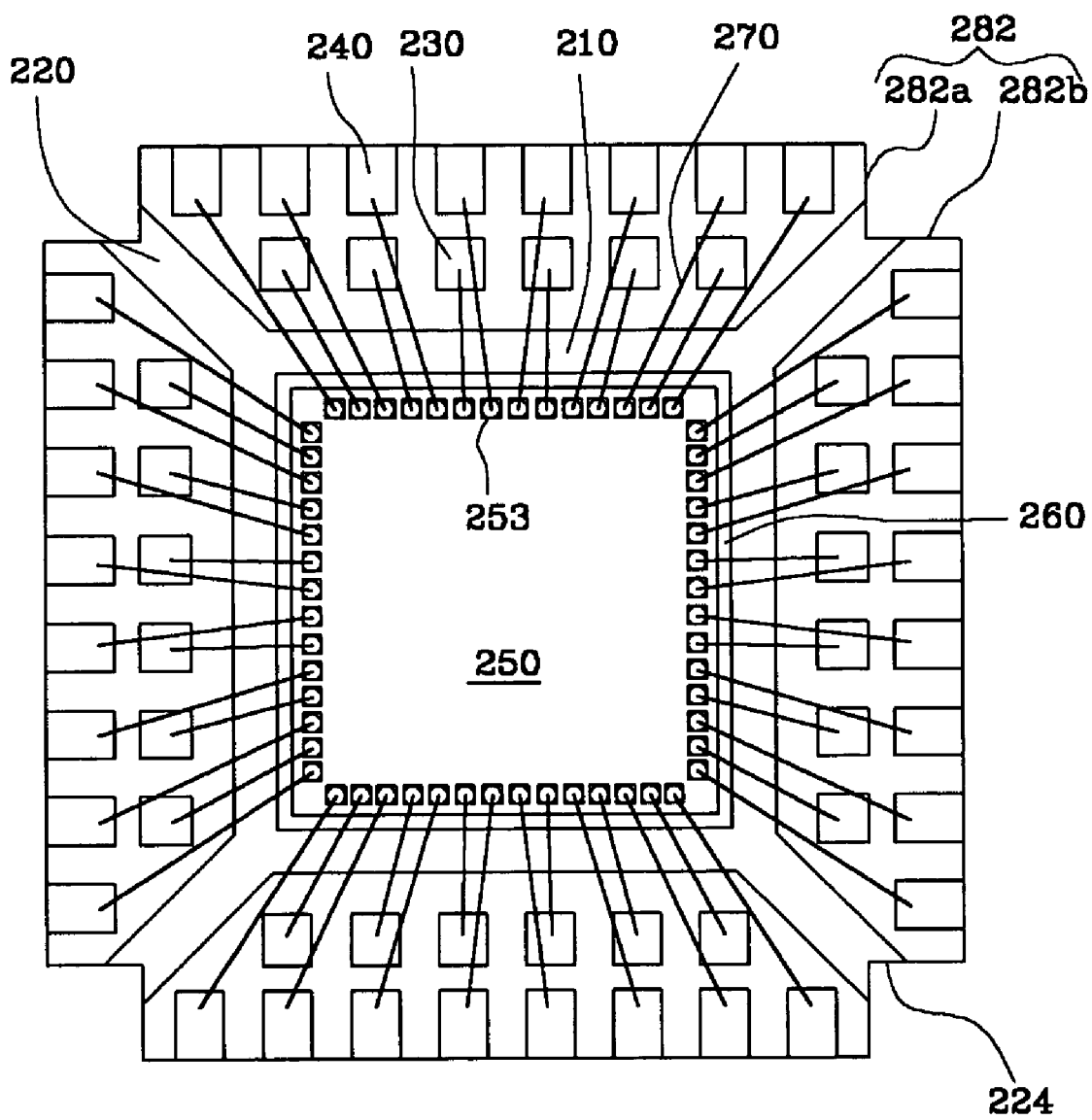
FIG. 2E is a top plan view of the semiconductor package of the second embodiment with the package body thereof being partially removed to depict the internal semiconductor die and conductive wires of the semiconductor package.

As seen in FIGS. 1C and 1D, the trenches 183 are formed in the package body 180 such that each of the leads 130 defines a side surface 133 which is exposed in and substantially flush with a corresponding surface of a respective one of the trenches 183. Similarly, each of the leads 140 defines a side surface 143 which is exposed in and substantially flush with a corresponding surface of a respective one of the trenches 183. As is best seen in FIG. 1B, the opposed ends of each of the trenches 183 extend to respective ones of a corresponding pair of the chamfers 182 formed at each of the four corners of the package body 180.

The package body 180 of the semiconductor package 100 is formed as a result of the hardening of an encapsulant material which is applied to the die paddle 110, tie bars 120, leads 130, 140, semiconductor die 150 and conductive wires 170 as indicated above. As best seen in FIG. 1D, this encapsulant material flows through each of the apertures 123 of the tie bars 120, thereby facilitating a firm mechanical interlock between the package body 180 and the tie bars 120. Additionally, as a result of the formation of the isolation trenches 183 in the package body 180, the outer, distal portion of each tie bar 120 is severed or separated from the remainder thereof. The resultant opposed pair of cut surfaces of each tie bar 120 are themselves exposed in and substantially flush with corresponding surfaces of a respective pair of the isolation trenches 183. The outer end surface 124 of each tie bar 120 is itself exposed in and substantially flush with a respective chamfer 182 of the package body 180. The flow of the encapsulant material over the etched surface 113 of the die paddle 110 facilitates a firm mechanical interlock between the die paddle 110 and the package body 180.

It is contemplated that the isolation trenches 183 will be formed through the completion of a saw singulation process, with a punch singulation process being employed to facilitate the complete separation of the semiconductor package 100 from other semiconductor packages 100 arranged in a common matrix. Thus, the punching operation will impart to the package body the eight-sided profile shown in FIGS. 1A and 1B, i.e., the four side surface segments and the four chamfers 182. As a result of such punch singulation process, the outer end of each lead 140 is exposed in and substantially flush with a respective peripheral side surface segment of the package body 180, in addition to the outer end surface 124 of each tie bar 120 being exposed in and substantially flush with a respective chamfer 182 as indicated above. As further seen in FIG. 1D, the apertures 123 are preferably oriented within each tie bar 120 such that one aperture 123 of each tie bar 120 is disposed between the trench 183 and the corresponding outer end surface 124. The filling of the apertures 123 with the encapsulant used to form the package body 180 and tight mechanical interlock facilitated thereby prevents chipping out and cracking which may otherwise occur in the chamfers 182 as a result of the punch singulation process. In this regard, the apertures 123 of each tie bar 120, at least one of which is formed in very close proximity to a corresponding chamfer 182, greatly improves the bonding force between the package body 180 and the leadframe of the semiconductor package 100, thereby preventing chip-out and cracking which may otherwise occur at the chamfers 182 of the package body 180. Those of ordinary skill in the art will recognize that such chip-out and crack prevention characteristics are also provided even if a saw singulation process is employed as an alternative to a punch singulation process to separate adjacent semiconductor packages 100 arranged in a matrix from each other.

Figure 3A:
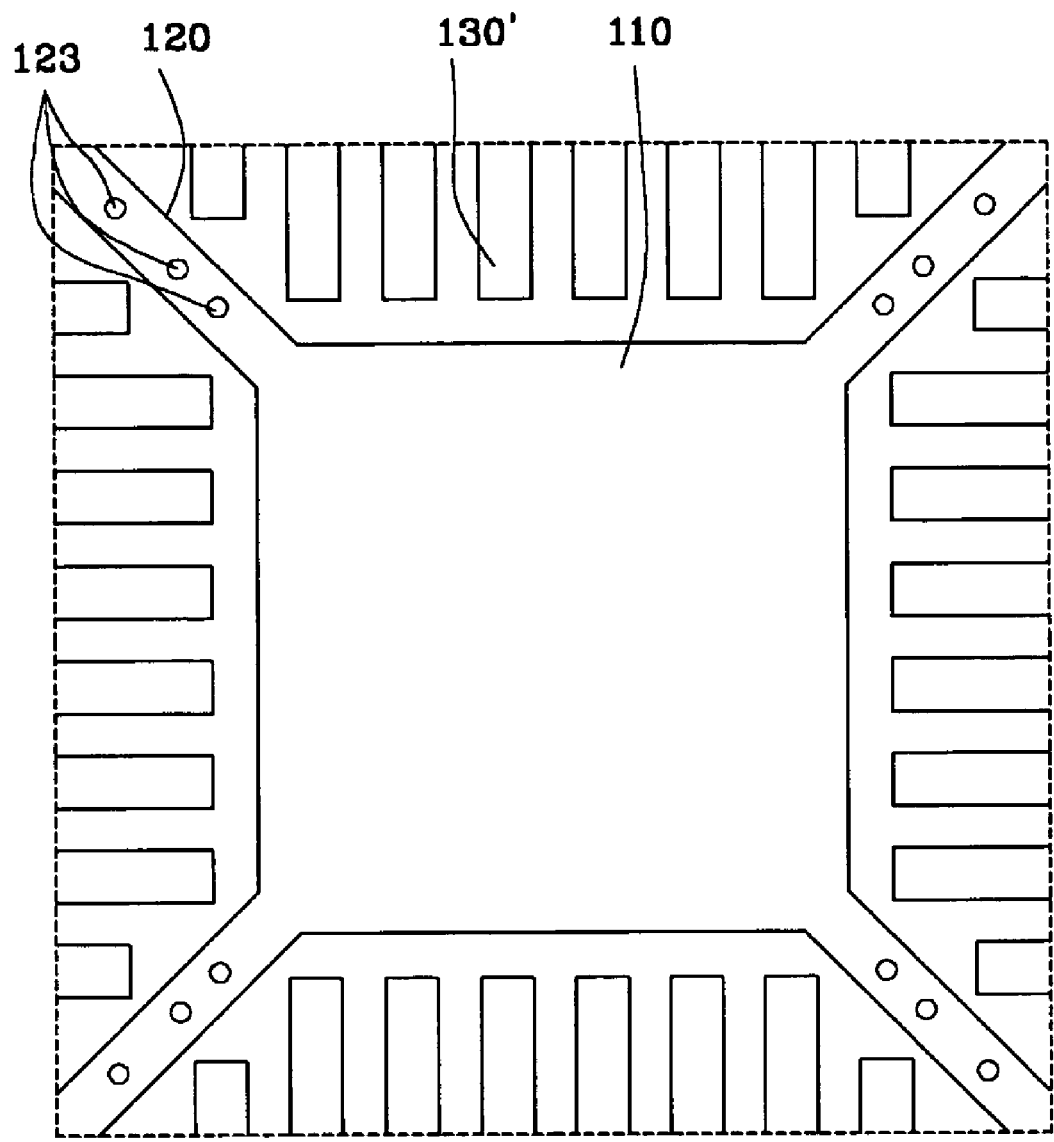
FIGS. 3A–3F illustrate an exemplary sequence of steps which may be used to facilitate the fabrication of the semiconductor package of the first embodiment shown in FIGS. 1A–1E.

Referring now to FIGS. 3A–3E, there is shown an exemplary sequence of steps which may be used to facilitate the fabrication of the semiconductor package 100 of the first embodiment of the present invention. The initial step of the fabrication method comprises providing the leadframe of the semiconductor package 100 (FIG. 3A). The leadframe includes an outer frame (not shown) having the die paddle 110 disposed in the approximate center thereof. The die paddle 110 is integrally connected to the outer frame by the four tie bars 120 which, as indicated above, extend diagonally from respective corners of the die paddle 110. Also integrally connected to the outer frame of the leadframe is a plurality of leads 130'. The leads 130' are segregated into four sets, with the leads 130' of each set extending toward a respective one of the four peripheral edge segments defined by the die paddle 110. The leads 130' of each set are of unequal lengths, with the outermost pair of leads 130' of each set being shorter than the remaining leads 130' of the same set. Those leads 130' of each set of greater length each define an inner, distal end which is disposed in spaced relation to a respective peripheral edge segment of the die paddle 110. The outermost pair of leads 130' of each set extend to and are spaced from respective ones of the four tie bars 120.

Figure 3B:
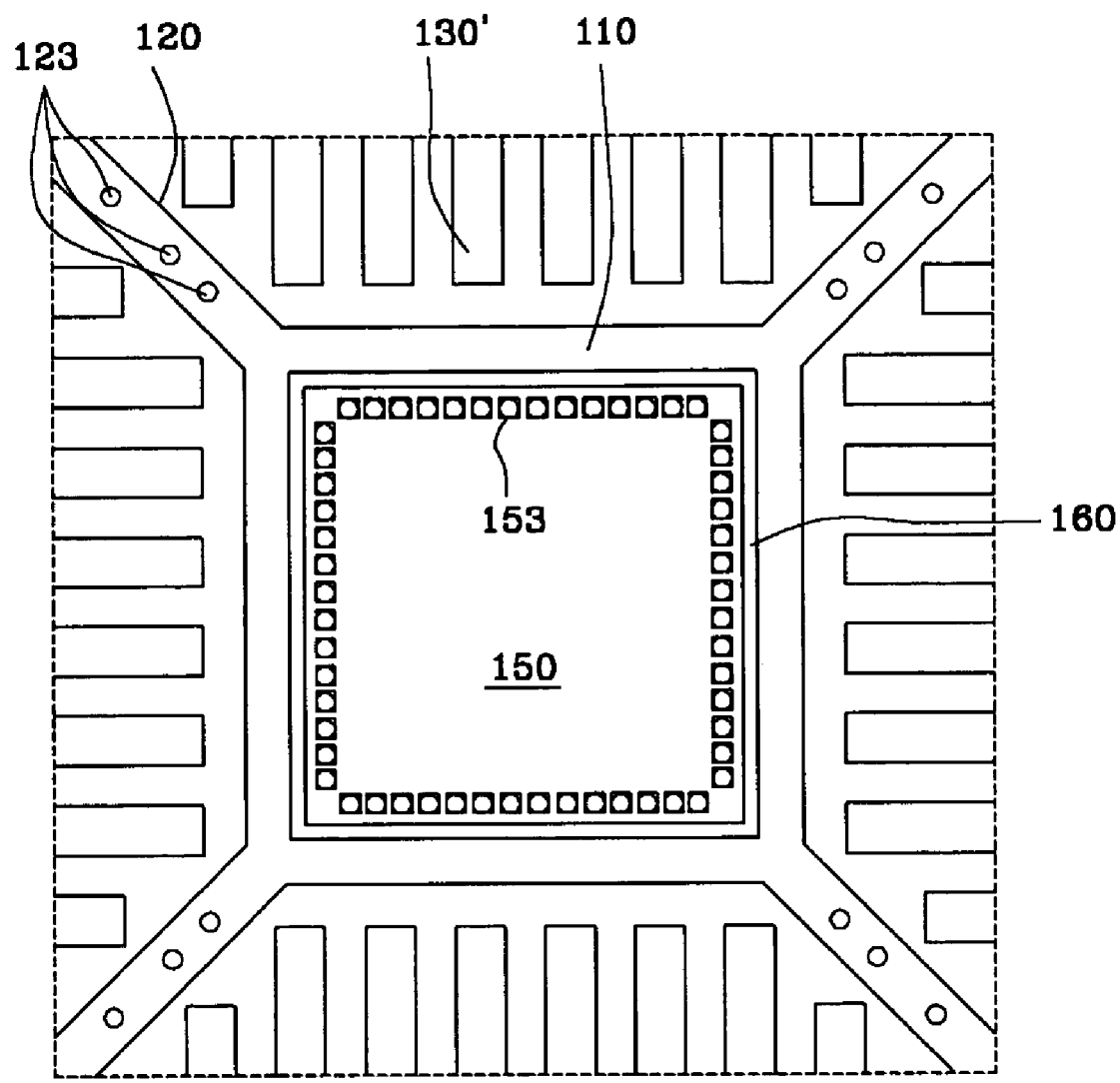
Figure 3C:
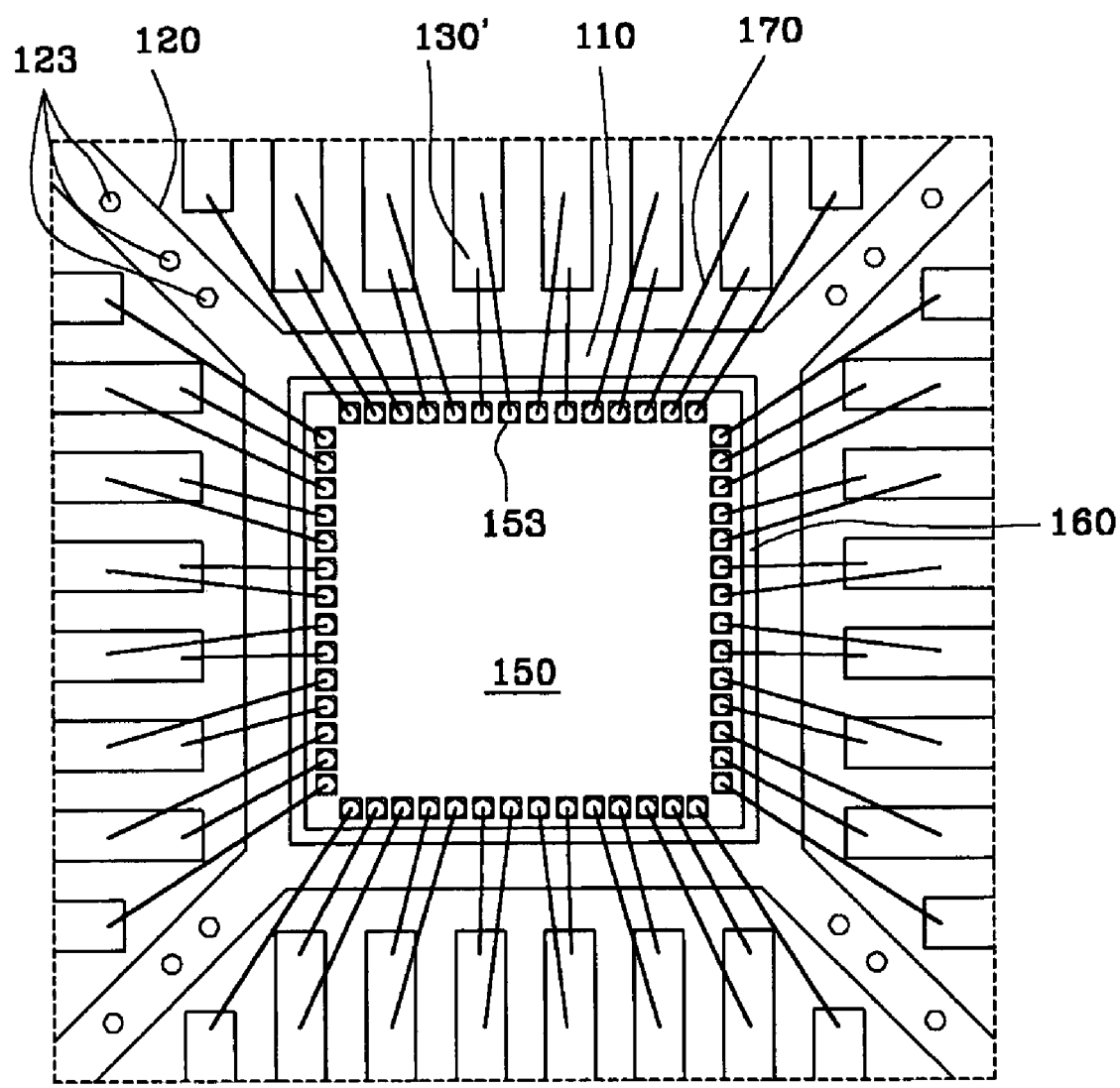

After the leadframe has been provided, the second surface 152 of the semiconductor die 150 is attached to the first surface 111 of the die paddle 110 through the layer 160 of the die attach material (FIG. 3B). Thereafter, the bond pads 153 of the semiconductor die 150 are electrically connected to the leads 130' through the use of the conductive wires 170 (FIG. 3C). As seen in FIG. 3C, those leads 130' of each set other than for the outermost pair are each electrically connected to two separate bond pads 153 through the use of two separate conductive wires 170. The leads 130' of the outermost pair of each set are each electrically connected to a single bond pad 153 through the use of a single conductive wire 170.

Figure 3D:
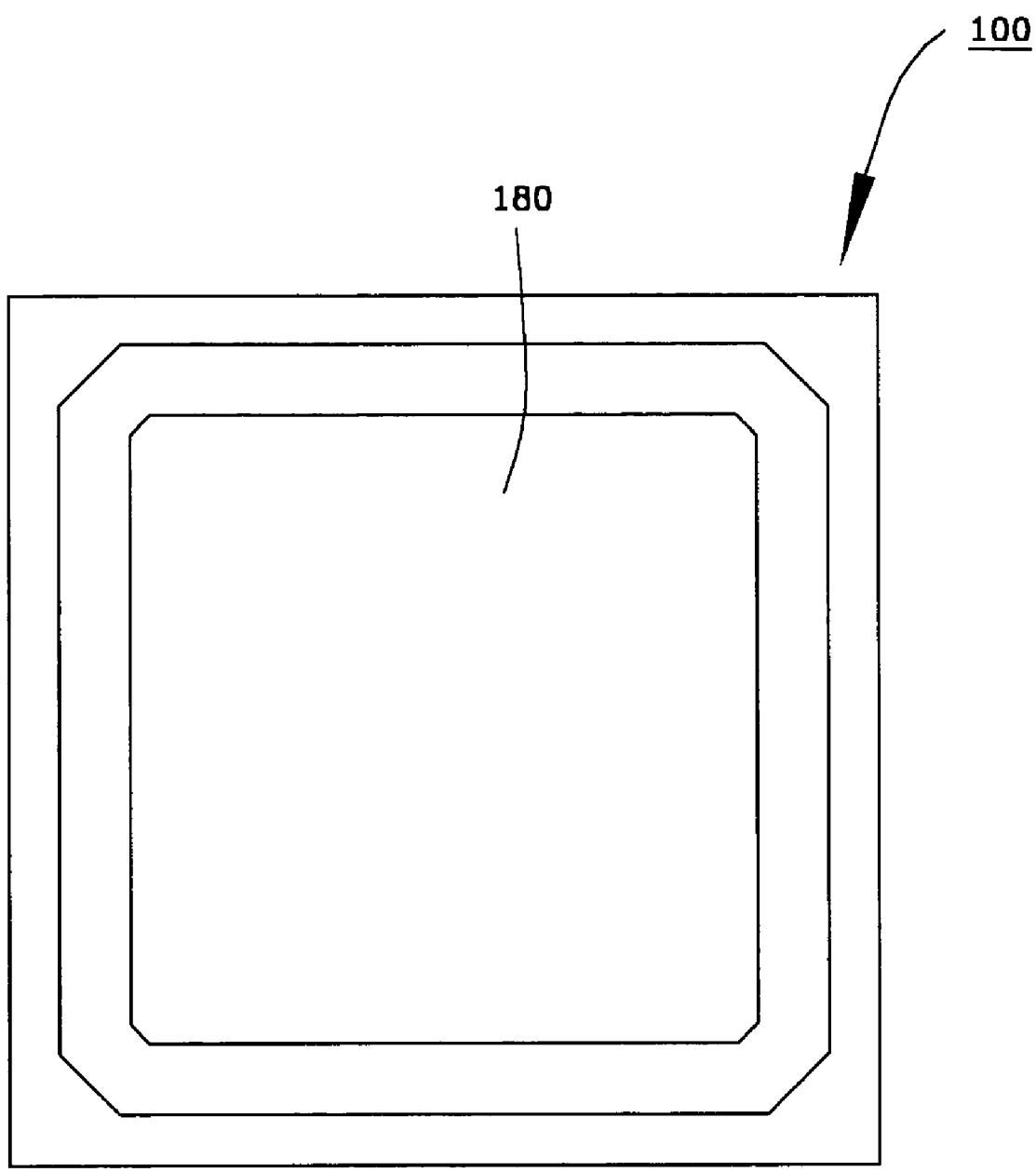

Subsequent to the electrical connection of the semiconductor die 150 to the leads 130' through the use of the conductive wires 170, an encapsulant material is applied to the die paddle 110, the tie bars 120, the leads 130', the semiconductor die 150 and the conductive wires 170 (FIG. 3D). As indicated above, the hardening of the encapsulant material facilitates the formation of the package body 180 of the semiconductor package 100. In addition to the second surface 112 of the die paddle 110 being exposed in and substantially flush with the lower surface 181 of the package body 180, the bottom surfaces of the leads 130' are also exposed in and substantially flush with the lower surface 181.

Figure 3E:
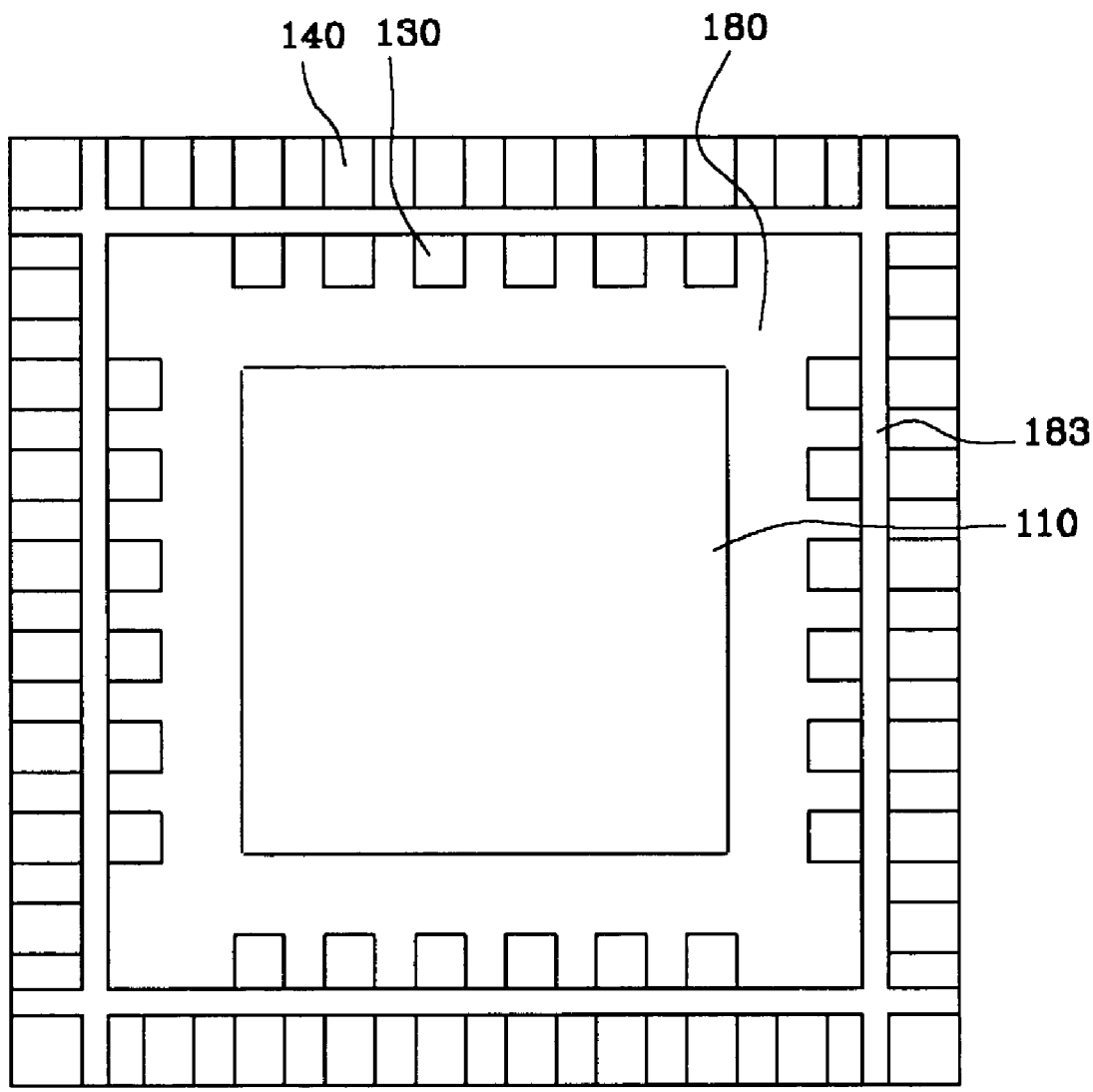

Subsequent to the formation of the package body 180, the isolation trenches 183 are formed in the lower surface 181 of the package body 180 (FIG. 3E). The isolation trenches 183 are formed in the lower surface 181 to a prescribed depth. As indicated above, the isolation trenches 183 are arranged in the lower surface 181 in a generally quadrangular (e.g., square) pattern. It is contemplated that the isolation trenches 183 will be formed through the implementation of a sawing process. Due to the size and orientation of the isolation trenches 183, the formation thereof effectively divides the leads 130' other than for the outermost pair of each set into the leads 130 of the inner set and the leads 140 of the outer set. Importantly, for each of the leads 130' to which two conductive wires 170 are electrically connected, the attachment points of the conductive wires 170 to each such lead 130' is such that subsequent to the formation of the trenches 183, one conductive wire 170 of the pair extends to the first surface 131 of the resultant lead 130, with the remaining conductive wire 170 of the pair extending to the first surface 141 of the corresponding lead 140. The depth of the isolation trenches 183 is such that the leads 130, 140 are in complete electrical isolation from each other.

Figure 3F:
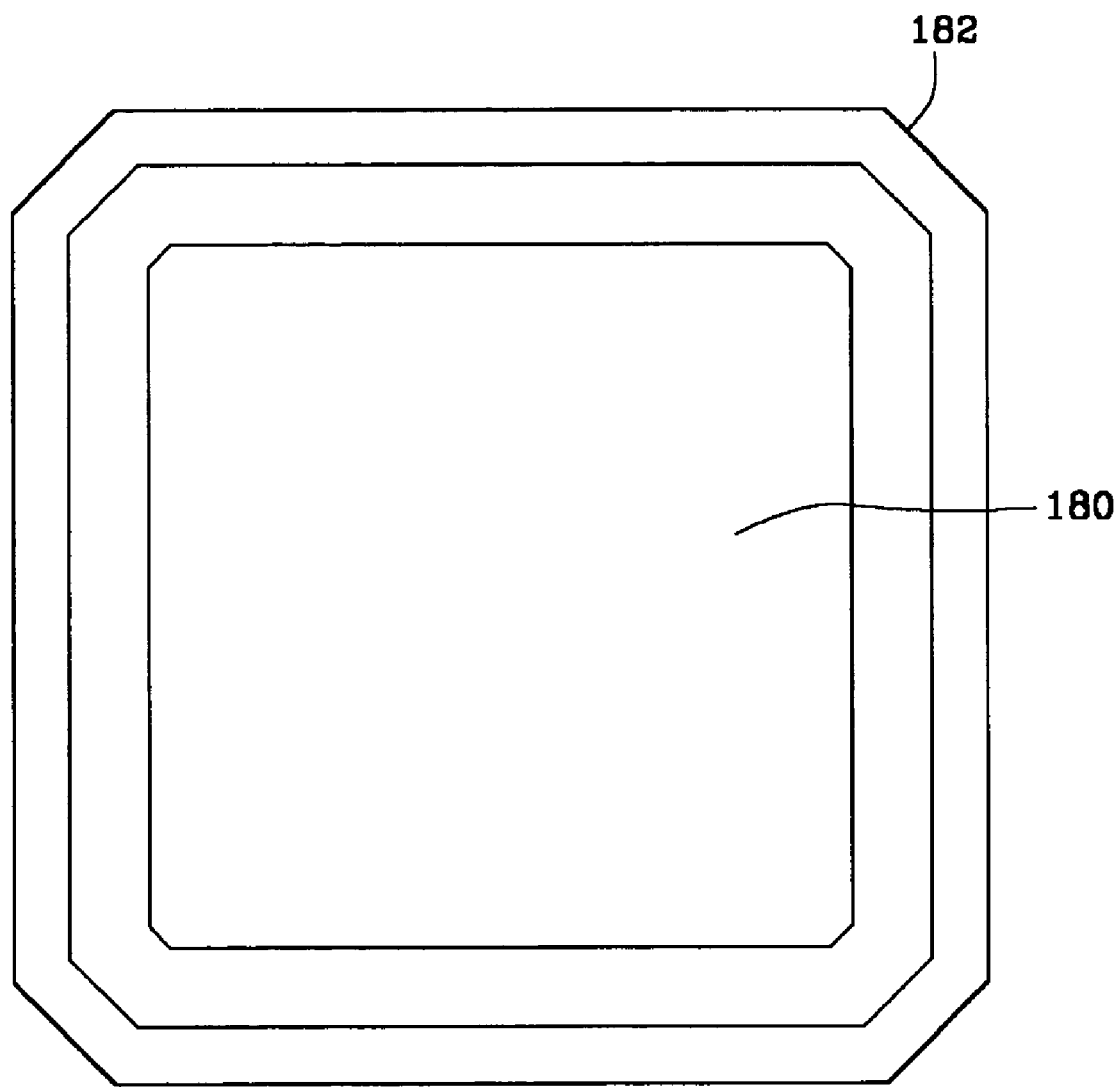

Subsequent to the formation of the isolation trenches 183, a singulation step is completed wherein at least the four corners of the package body 180 are cut to facilitate the formation of the chamfers 182 thereon (FIG. 3F). It is contemplated that such singulation will be completed through the implementation of a punching operation. The punch singulation process, in addition to facilitating the formation of the chamfers 182, may further effectively separate the package body 182 from the package bodies 182 of other semiconductor packages 100 arranged in a common matrix. The singulation step effectively cuts or severs the tie bars 120 from the outer frame in a manner causing the outer end surfaces 124 thereof to be exposed in and substantially flush with respective ones of the chamfers 182 in the above-described manner. However, as a result of the flow of the encapsulant material of the package body 180 through the aperture(s) 123 of each tie bar 120, occurrences of chip-out or cracking in the corners of the package body 180 in the vicinity of the chamfers 182 is substantially prevented. In addition to severing the tie bars 120 from the outer frame of the leadframe, the punching operation will also typically facilitate the cutting or severing of the leads 140 from the outer frame of the leadframe, thus resulting in the cut distal ends of the leads 140 being exposed in and substantially flush with respective ones of the four side surface segments of the package body 180. As indicated above, a saw singulation process may be used as an alternative to the punch singulation process to complete the fabrication of the semiconductor package 100.

Referring now to FIGS. 2A–2E, there is shown a semiconductor package 200 constructed in accordance with a second embodiment of the present invention. In FIGS. 2A–2E, the 200 series reference numerals are used to identify elements corresponding to those identified with the 100 series reference numerals in FIGS. 1A–1E. The major distinction between the semiconductor packages 100, 200 lies in the configuration of the package body 280 of the semiconductor package 200 in comparison to the package body 180 of the semiconductor package 100. More particularly, the package body 280 is formed to have a generally quadrangular configuration, with recesses 282 being formed at each of the four corners thereof. Each of the recesses 282 is defined by a first recess wall 282a and a second recess wall 282b, the first and second recess walls 282a, 282b being separated from each other at an angular interval of approximately 90°, i.e., the second recess wall 282b extends in generally perpendicular relation to the first recess wall 282a in each recess 282. As is best seen in FIGS. 2A, 2B, 2D and 2E, as a result of the formation of the recesses 282 within the package body 280, portions of the outer end surface 224 of each tie bar 220 are exposed in and substantially flush with each of the first and second recess walls 282a, 282b of a respective one of the recesses 282. As will be described in more detail below, the recesses 282 of the package body 280 are preferably formed as a result of the design of the mold used to facilitate the formation of the package body 280. As a result, the severing of the tie bars 220 and leads 240 from the outer frame of the leadframe of the semiconductor package 200 is completed by a singulation process (e.g., punching or sawing) as will be discussed in more detail below.

Figure 4A:
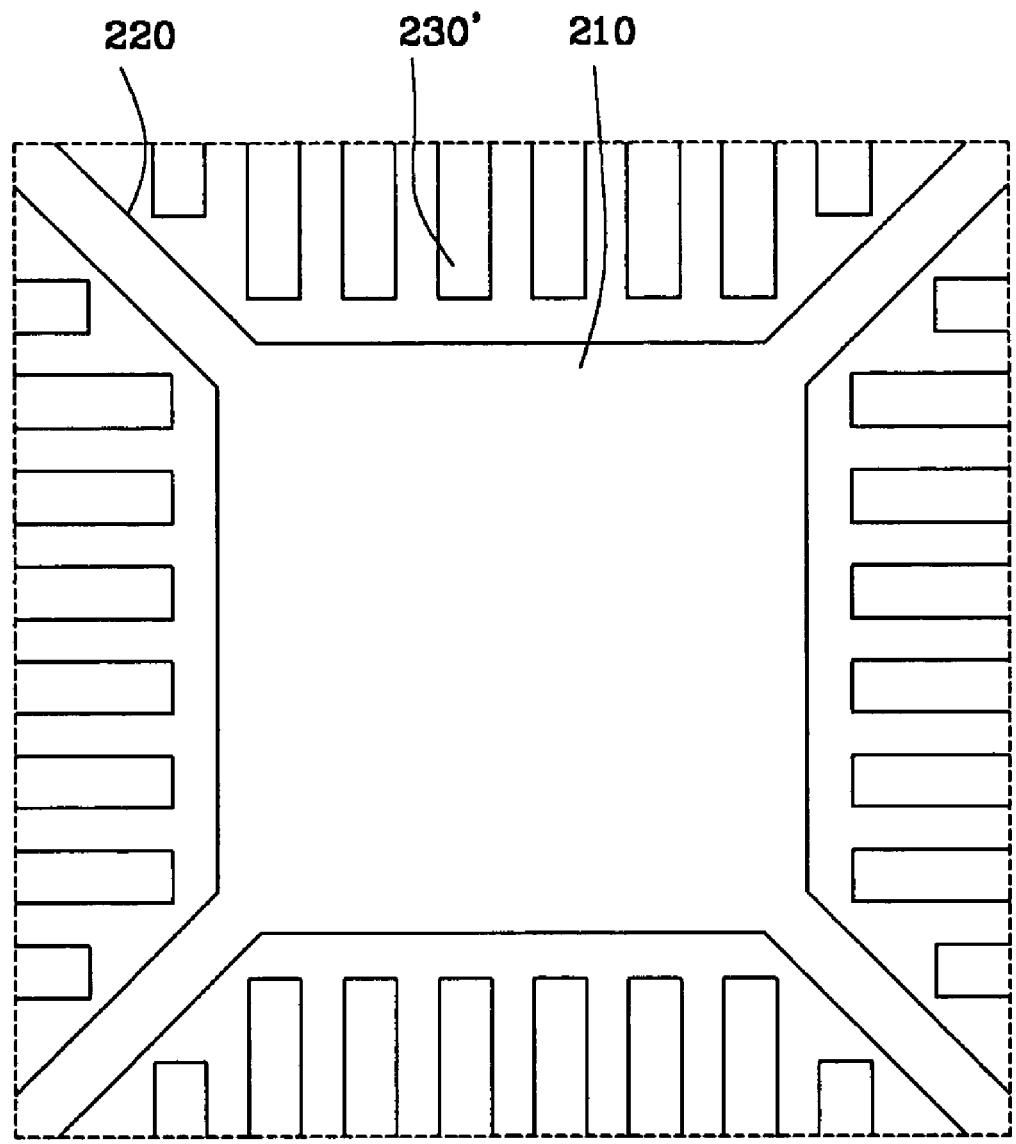
FIGS. 4A–4F illustrate an exemplary sequence of steps which may be used to facilitate the fabrication of the semiconductor package of the second embodiment shown in FIGS. 2A–2E.
Figure 4B:
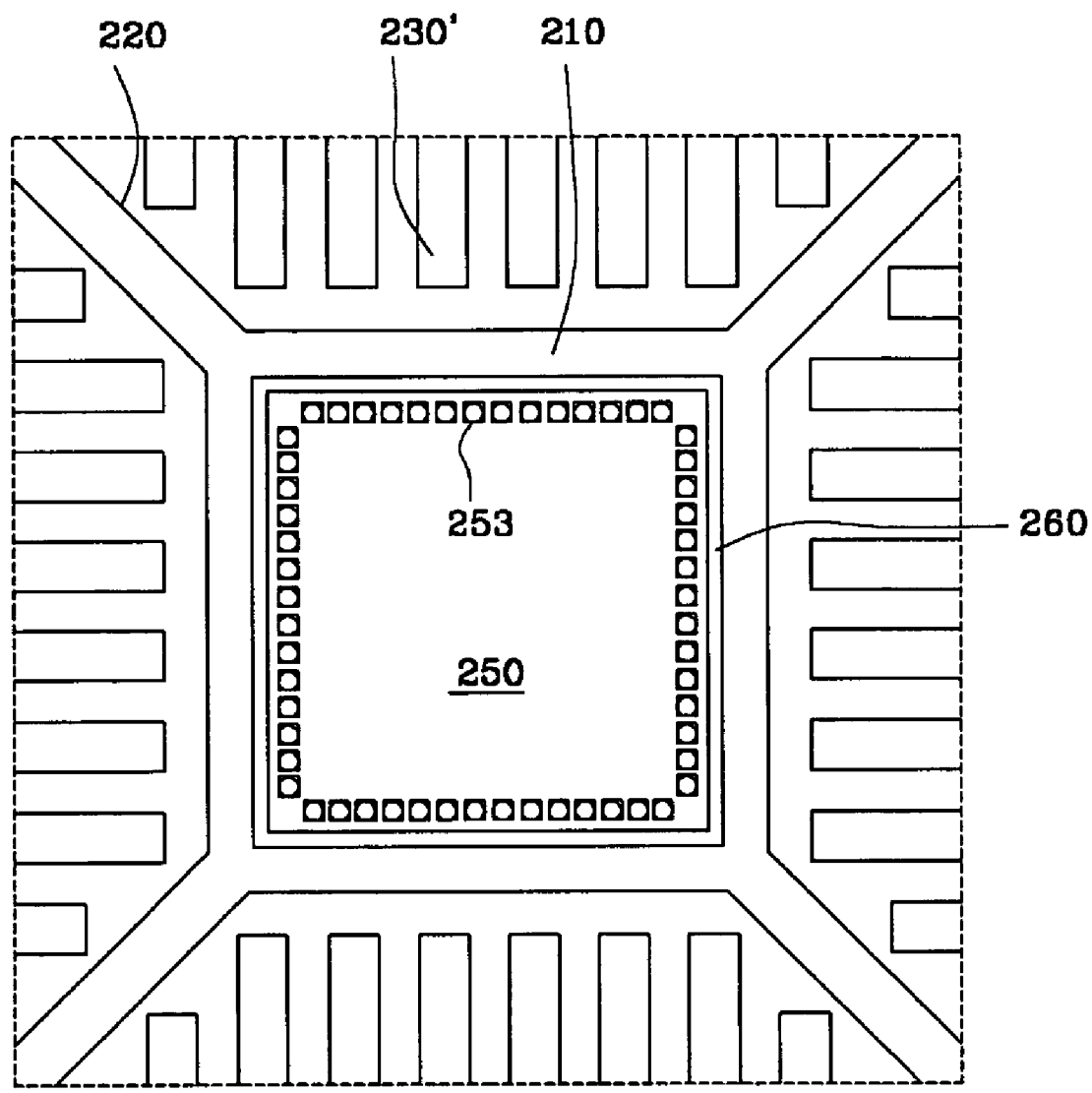
Figure 4C:
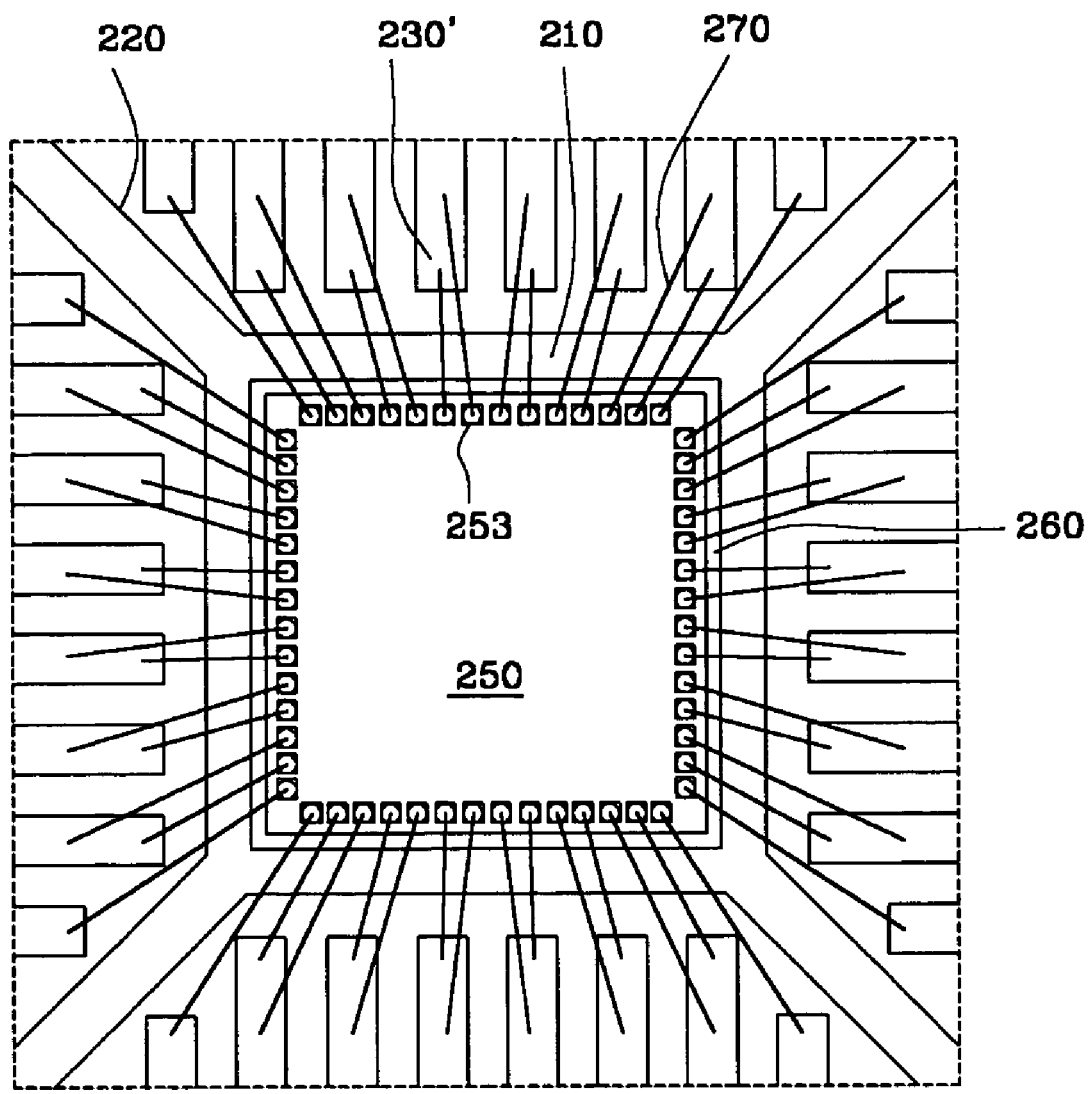

Referring now to FIGS. 4A–4F, there is shown an exemplary sequence of steps which may be used to facilitate the fabrication of the semiconductor package 200 of the second embodiment of the present invention. In FIGS. 4A–4F, the 200 series reference numerals are used to identify elements corresponding to those identified with the 100 series reference numerals in FIGS. 3A–3F. In this regard, those steps of the fabrication methodology for the semiconductor package 200 as shown in FIGS. 4A, 4B and 4C mirror those used in relation to the semiconductor package 100 as shown and described above in relation to FIGS. 3A, 3B and 3C.

Figure 4D:
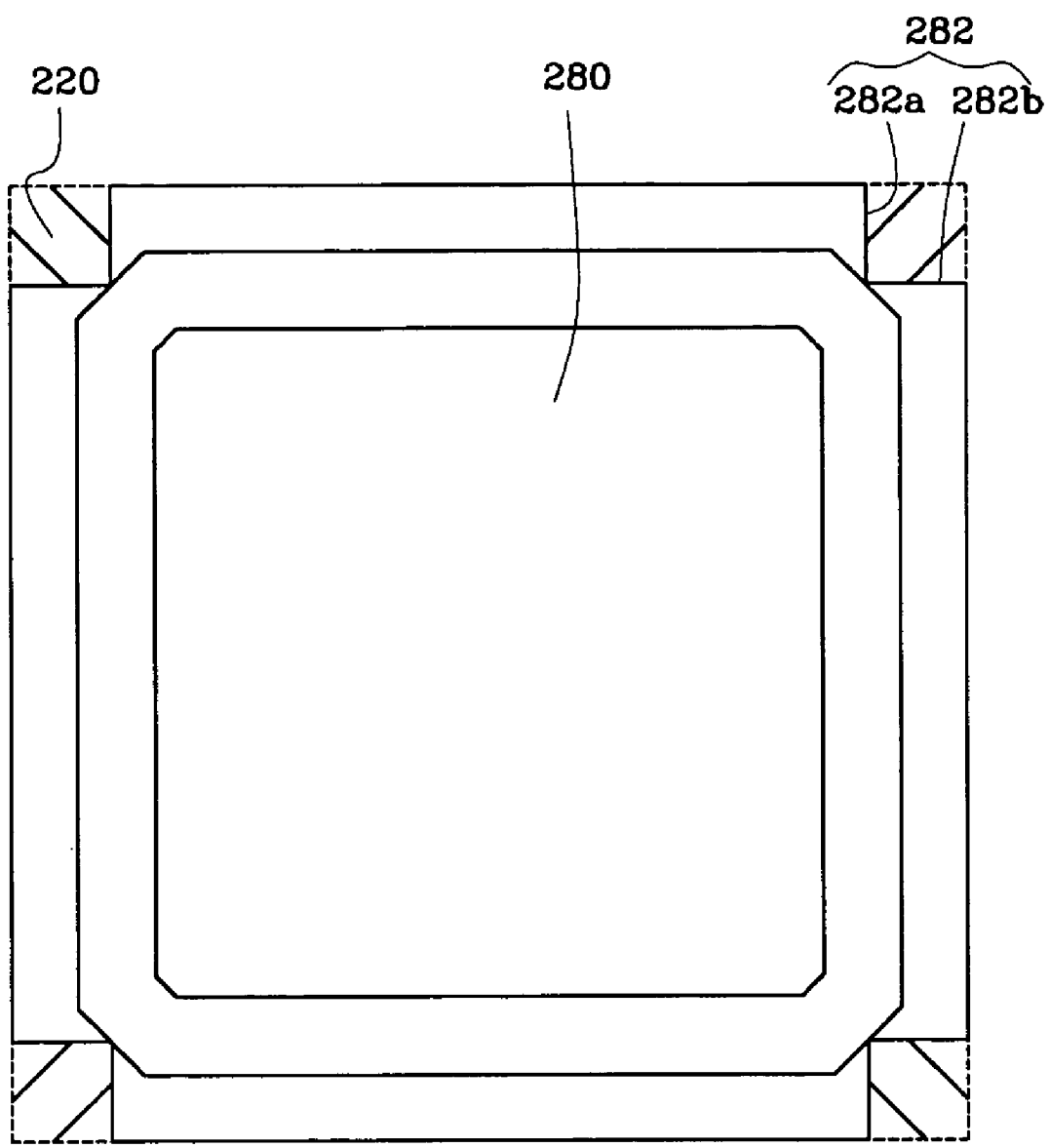

In the process of fabricating the semiconductor package 200, subsequent to the electrical connection of the semiconductor die 250 to the leads 230' through the use of the conductive wires 270, an encapsulant material is applied to the die paddle 210, the tie bars 220, the leads 230', the semiconductor die 250 and the conductive wires 270 (FIG. 4D). The hardening of the encapsulant material facilitates the formation of the package body 280 of the semiconductor package 200. As indicated above, the mold design used to facilitate the fabrication of the package body 280 is such that each of the four corners of the package body 280 includes on of the above-described recesses 282 formed therein. The second surface 212 of the die paddle 210 and bottom surfaces of the leads 230' are exposed in and substantially flush with the lower surface 281 of the package body 280. Outer, distal portions of each of the tie bars 220 (which do not include the above-described apertures 123) extend into and are thus exposed in respective ones of the recesses 282.

Figure 4E:
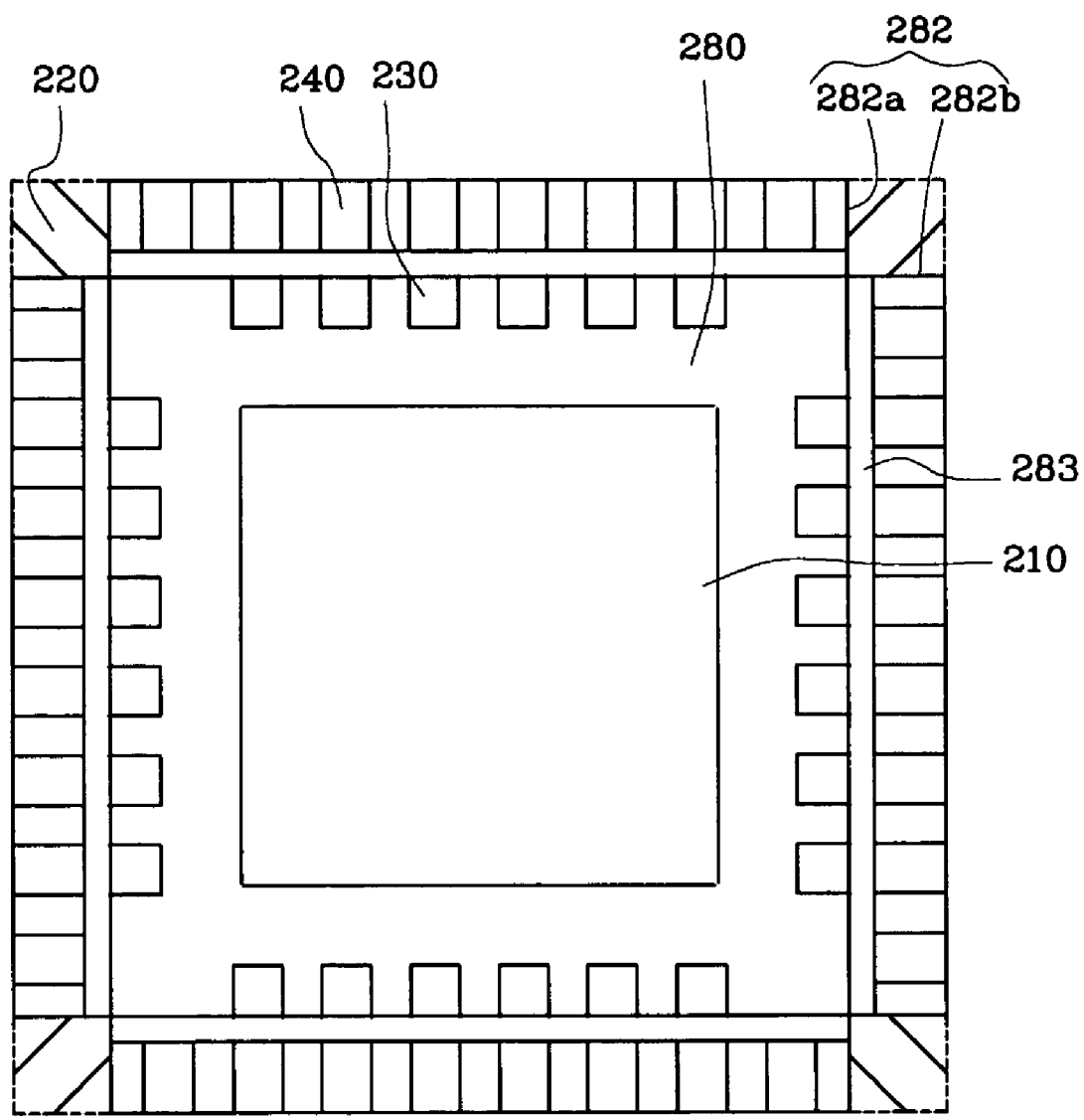

Subsequent to the formation of the package body 280, the isolation trenches 283 are formed in the lower surface 281 of the package body 280 (FIG. 4E). The isolation trenches 283 are arranged in the lower surface 281 in a generally quadrangular (e.g., square) pattern. It is contemplated that the isolation trenches 283 will be formed through the implementation of a sawing process. Due to the size and orientation of the isolation trenches 283, the formation thereof effectively divides the leads 230' other than for the outermost pair of each set into the leads 230 of the inner set and the leads 240 of the outer set. Importantly, for each of the leads 230' to which two conductive wires 270 are electrically connected, the attachment points of the conductive wires 270 to each such lead 230' is such that subsequent to the formation of the trenches 283, one conductive wire 270 of the pair extends to the first surface 231 of the resultant lead 230, with the remaining conductive wire 270 of the pair extending to the first surface 241 of the corresponding lead 240. The depth of the isolation trenches 283 is such that the leads 230, 240 are in complete electrical isolation from each other.

Figure 4F:
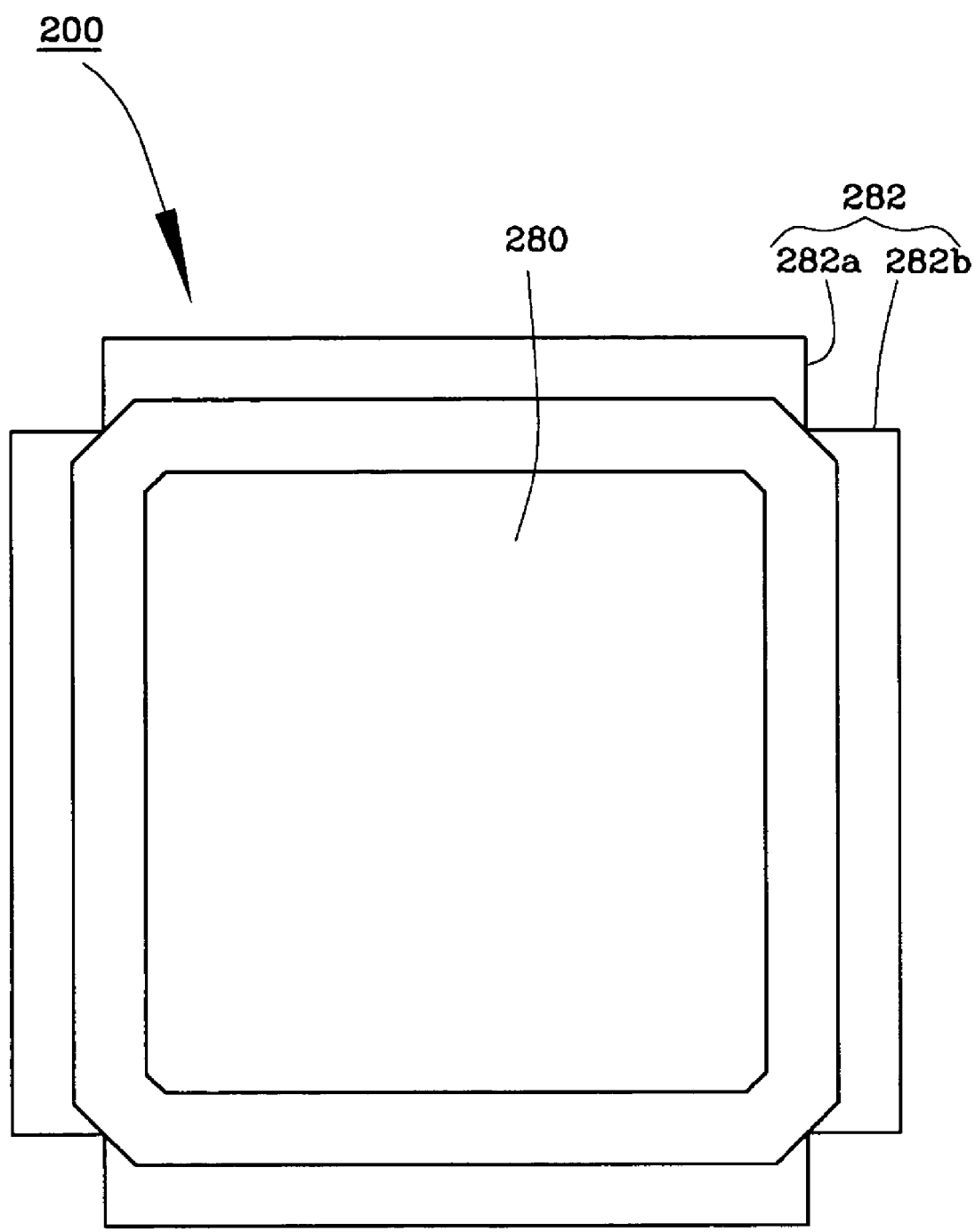

Subsequent to the formation of the isolation trenches 283, a singulation step is completed wherein the exposed portions of the tie bars 220 are cut or singulated (FIG. 4F). It is contemplated that such singulation will be completed through the implementation of a punching or sawing operation. The completion of the singulation process effectively separates the tie bars 220 from the outer frame of the leadframe, and results in portions of the end surfaces 224 of each tie bar 220 being exposed in and substantially flush with the first and second recess walls 282a, 282b, of the corresponding recess 282 in the above-described manner. This cutting or singulation process, whether by punching or by sawing, will also typically be used to facilitate the cutting or severing of the leads 240 from the outer frame of the leadframe. The cutting of the leads 240 from the outer frame of the leadframe results in the distal ends of the leads 240 being exposed in and substantially flush with respective ones of the four side surface segments of the package body 280.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a die paddle defining multiple corners and opposed first and second surfaces;
   at least one set of leads extending at least partially about the die paddle in spaced relation thereto, each of the leads having opposed first and second surfaces;
   at least one tie bar attached to and extending from one of the corners of the die paddle, the tie bar having opposed first and second surfaces and at least one aperture disposed therein and extending between the first and second surfaces thereof;
   a semiconductor die attached to the first surface of the die paddle and electrically connected to at least one of the leads; and
   a package body at least partially covering the die paddle, the leads, the tie bar, and the semiconductor die such that the second surfaces of the leads are exposed in a common exterior surface of the package body, and a portion of the package body extends through the aperture of the tie bar.

2. The semiconductor package of claim 1 wherein:
   the die paddle has a quadrangular configuration defining four corners; and
   four tie bars are attached to and extend diagonally from respective ones of the four corners of die paddle.

3. The semiconductor package of claim 2 wherein:
   each of the tie bars defines an outer end surface; and
   the at least one aperture of each of the tie bars is disposed in close proximity to the outer end surface thereof.

4. The semiconductor package of claim 3 wherein:
   the package body defines four chamfers; and
   the outer end surface of each of the tie bars extends to a respective one of the chamfers.

5. The semiconductor package of claim 4 wherein:
   each of the tie bars includes a plurality of apertures disposed therein;
   portions of the package body extend through each of the apertures of each of the tie bars; and
   one of the apertures of each of the tie bars is disposed in close proximity to the outer end surface thereof.

6. The semiconductor package of claim 5 wherein:
   the first and second surfaces of the die paddle are each generally planar;
   the die paddle includes an etched surface which circumvents the second surface thereof;
   the first and second surfaces of each of the tie bars are each generally planar;
   the first surface of each of the tie bars extends in substantially co-planar relation to the first surface of the die paddle; and the second surface of each of the tie bars extends in substantially co-planar relation to the etched surface of the die paddle.

7. The semiconductor package of claim 6 wherein:
the first and second surfaces of each of the leads are each generally planar;
the first surface of each of the leads extends in substantially co-planar relation to the first surface of the die paddle;
the second surface of each of the leads extends in substantially co-planar relation to the second surface of the die paddle; and
the second surfaces of the leads and the second surface of the die paddle are exposed in and substantially flush with the exterior surface of the package body.

8. The semiconductor package of claim 7 wherein the leads are arranged in an inner set which extends at least partially about the die paddle in spaced relation thereto, and an outer set which extends at least partially about the inner set in spaced relation thereto.

9. The semiconductor package of claim 8 wherein the leads of the inner set and the leads of the outer set are separated from each other by a plurality of isolation trenches formed in the exterior surface of the package body.

10. The semiconductor package of claim 9 wherein portions of each of the leads of the inner and outer sets are exposed in respective ones of the isolation trenches.

11. The semiconductor package of claim 1 wherein the leads are arranged in an inner set which extends at least at partially about the die paddle in spaced relation thereto, and an outer set which extends at least partially about the inner set in spaced relation thereto.

12. The semiconductor package of claim 11 wherein the leads of the inner set and the leads of the outer set are separated from each other by a plurality of isolation trenches formed in the exterior surface of the package body.

13. The semiconductor packager of claim 12 wherein portions of each of the leads of the inner and outer sets are exposed in respective ones of the isolation trenches.

14. The semiconductor package of claim 1 wherein the semiconductor die is electrically connected to the first surfaces of the leads via conductive wires which are covered by the package body.

15. The semiconductor package of claim 1 wherein the aperture of the tie bar has a circular configuration.

16. A semiconductor package, comprising:
a quadrangular die paddle defining four corners and opposed, generally planar first and second surfaces;
at least one set of leads extending at least partially about the die paddle in spaced relation thereto, each of the leads defining opposed, generally planar first and second surfaces;
four tie bars attached to and extending diagonally from respective ones of the four corners of the die paddle, each of the tie bars defining opposed, generally planar first and second surfaces and an outer end surface;
a semiconductor die attached to the first surface of the die paddle and electrically connected to at least one of the leads; and
a quadrangular package body having four corners and a recess formed within each of the corners thereof, the package body at least partially covering the die paddle, the leads, the tie bars and the semiconductor die such that the second surfaces of the leads are exposed in and substantially flush with a common exterior surface of the package body, and the outer end surface of each of the tie bars is exposed in a respective one of the recesses of the package body.

17. The semiconductor package of claim 16 wherein:
each of the recesses defines first and second recess walls; and
portions of the outer end surface of each of the tie bars are exposed in each of the first and second recess walls of a respective one of the recesses.

18. The semiconductor package of claim 17 wherein the first and second recess walls of each of the recesses extend in generally perpendicular relation to each other.

19. The semiconductor package of claim 18 wherein:
the die paddle includes an etched surface which circumvents the second surface thereof;
the first surface of each of the tie bars extends in substantially co-planar relation to the first surface of the die paddle; and
the second surface of each of the tie bars extends in substantially co-planar relation to the etched surface of the die paddle.

20. The semiconductor package of claim 19 wherein:
the first surface of each of the leads extends in substantially co-planar relation to the first surface of the die paddle;
the second surface of each of the leads extends in substantially co-planar relation to the second surface of the die paddle; and
the second surfaces of the leads and the second surface of the die paddle are exposed in and substantially flush with the exterior surface of the package body.

21. The semiconductor package of claim 20 wherein the leads are arranged in an inner set which extends at least partially about the die paddle in spaced relation thereto, and an outer set which extends at least partially about the inner set in spaced relation thereto.

22. The semiconductor package of claim 21 wherein the leads of the inner set and the leads of the outer set are separated from each other by a plurality of isolation trenches formed in the exterior surface of the package body.

23. The semiconductor package of claim 22 wherein portions of each of the leads of the inner and outer sets are exposed in respective ones of the isolation trenches.

24. The semiconductor package of claim 16 wherein the semiconductor die is electrically connected to the first surfaces of the leads via conductive wires which are covered by the package body.

25. A semiconductor package, comprising:
a die paddle defining opposed first and second surfaces;
an inner set of leads extending at least partially about the die paddle in spaced relation thereto;
an outer set of leads extending at least partially about the leads of the inner set in spaced relation thereto, at least some of the leads of the outer set being aligned with respective ones of the leads of the inner set, with each of the leads of the inner and outer sets having opposed first and second surfaces;
a semiconductor die attached to the first surface of the die paddle and electrically connected to at least one of the leads of each of the inner and outer sets thereof; and
a package body at least partially covering the die paddle, the leads of the inner and outer sets, and the semiconductor die such that the second surfaces of the leads of the inner and outer sets are each exposed in a common exterior surface of the package body, the leads of the outer set being separated from the leads of the inner set by at least one elongate trench which is formed in the common exterior surface of the package body.

* * * * *